United States Patent
Mochizuki et al.

(10) Patent No.: US 6,858,983 B2
(45) Date of Patent: Feb. 22, 2005

(54) DISPLAY DEVICE HAVING CONICAL TRANSPARENT MEMBERS COVERING ELECTROLUMINESCENT ELEMENTS

(75) Inventors: Noritaka Mochizuki, Kanagawa (JP); Ryuji Tokuda, Kanagawa (JP); Michitaka Setani, Kanagawa (JP); Masanori Sakuranaga, Kanagawa (JP); Hikaru Hoshi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 223 days.

(21) Appl. No.: 09/993,672

(22) Filed: Nov. 27, 2001

(65) Prior Publication Data

US 2002/0105267 A1 Aug. 8, 2002

(30) Foreign Application Priority Data

Dec. 5, 2000 (JP) ........................................ 2000-370647
Dec. 27, 2000 (JP) ........................................ 2000-398283
Mar. 6, 2001 (JP) ........................................ 2001-062055
Jun. 22, 2001 (JP) ........................................ 2001-189722
Oct. 2, 2001 (JP) ........................................ 2001-306539

(51) Int. Cl.$^7$ ............................ H01J 1/62; H01J 63/04
(52) U.S. Cl. ................... 313/512; 313/498; 313/506; 313/113; 349/62; 349/67; 257/98; 257/99
(58) Field of Search ............................... 313/512, 498, 313/506, 113; 349/62, 67, 69; 257/98, 99

(56) References Cited

U.S. PATENT DOCUMENTS

| 4,534,622 | A | * | 8/1985 | Harada et al. | ................. 349/24 |
| 5,275,967 | A | * | 1/1994 | Taniguchi et al. | ............. 438/22 |
| 5,668,649 | A | * | 9/1997 | Suzuki et al. | ................. 349/42 |
| 6,208,390 | B1 | * | 3/2001 | Ejiri et al. | ..................... 349/43 |
| 6,607,277 | B2 | * | 8/2003 | Yokoyama et al. | ........... 353/52 |

FOREIGN PATENT DOCUMENTS

| JP | 03152898 A | * | 6/1991 | ........... H05B/33/14 |
| JP | 8-8065 | | 1/1996 | |

* cited by examiner

Primary Examiner—Joseph Williams
Assistant Examiner—Kevin Quarterman
(74) Attorney, Agent, or Firm—Fitzpatrick, Cella, Harper & Scinto

(57) ABSTRACT

A display device includes a transparent substrate, a plurality of electroluminescent elements arranged on the transparent substrate, transparent members respectively covering the electroluminescent elements, and reflection films formed respectively on the surfaces of the transparent members. Each of the electroluminescent elements is formed by sequentially laying a transparent electrode, an electroluminescent layer and a reflector electrode on the transparent substrate. Each of the transparent members has a profile of a frustum of pyramid or cone, or partly has a curved surface showing a positive curvature and a curved surface showing a negative curvature at the portion held in contact with the transparent substrate.

21 Claims, 13 Drawing Sheets

DISPLAY DEVICE HAVING CONICAL TRANSPARENT MEMBERS COVERING ELECTROLUMINESCENT ELEMENTS

BACKGROUND OF THE INVENTION

1. Field of the Invention

This invention relates to a display device. More particularly, it relates to a display device adapted to highly efficiently take out light emitted from electroluminescent (EL) elements that operate as so many display pixels to the outside.

2. Related Background Art

Display devices comprising a plurality of EL elements arranged two-dimensionally on a same substrate are known. However, in any known display devices, the ratio of the quantity of light that can be externally taken out to the total quantity of light emitted from each of the EL elements is not very large.

FIG. 1 of the accompanying drawings is a schematic cross sectional view of an EL element of a known display device, illustrating its basic structure. Referring to FIG. 1, the EL element 600 is formed by sequentially laying a transparent electrode 520, an electroluminescent (EL) layer 510 and a reflector electrode 500 on a transparent substrate 550 in the above mentioned order. Light emitted from the EL layer 510 is totally reflected at the interface B1 of the transparent substrate 550 and the transparent electrode 520 and the interface B2 of the transparent substrate 550 and ambient air. If the refractive index of the transparent electrode 520 is 1.8 and that of the transparent substrate 550 is 1.5, the quantity of light confined within the EL element 600 due to total reflection at the interface B1 is about 51% of the total quantity of light emitted from the EL element 600. On the other hand, the quantity of light confined within the EL element 600 due to total reflection at the interface B2 is about 32% of the total quantity of light emitted from the EL element 600. Therefore, the quantity of light that can be externally taken out from the transparent substrate 550 is only about 17% of the total quantity of emitted light.

Meanwhile, Optics Letters, Mar. 15 (1997) pp. 396 to 398, discloses an EL element realized by adding a transparent member having a trapezoidal cross section to the above described basic structure, from which light can be taken out at an improved efficiency. FIG. 2 of the accompanying drawings is a schematic cross sectional view of such an EL element. In FIG. 2, the components that are same as those of FIG. 1 are denoted respectively by the same reference symbols.

Referring to FIG. 2, the EL element 600 has a sandwich structure where an EL layer 510 is sandwiched between a reflector electrode 500 and a transparent electrode 520. The EL element 600 is laid on a transparent member 540 having a trapezoidal cross section and formed on a transparent substrate 550. When such EL elements are applied to a two-dimensional display device, the transparent member 540 of each EL element is typically realized in the form of a frustum of quadrangular pyramid. Then, a reflection film 530 is formed on the slopes of the transparent member 540.

With an EL element 600 having a configuration as shown in FIG. 2, no total reflection takes place at the interface 1 when the refractive index of the transparent member 540 is made greater than that of the transparent electrode. On the other hand, if total reflection occurs at the interface 2 of the transparent substrate 550 and ambient air, light $I_2$ totally reflected by the interface 2 is reflected again by the reflection film 530 and taken out of the transparent substrate 550 into ambient air. Similarly, if total reflection occurs at the interface 3 of the transparent member 540 and the transparent substrate 550, light $I_3$ totally reflected by the interface 3 is reflected again by the reflection film 530 and taken out of the transparent member 540. It may be needless to note that light emitted from the EL layer 510, transmitted through the transparent electrode 520 and directly reflected by the reflection film 530 goes out of the transparent substrate 550 into ambient air. Therefore, the above described arrangement allows light emitted from the EL layer 510 to be highly efficiently taken out to the outside.

However, if the reflection film 530 formed on the slopes of the transparent member 540 is made of metal in the above described EL element, it needs to be formed so as not to contact the transparent electrode 520 and the reflector electrode 500. It is not easy to form such a reflection film. Additionally, although not shown in FIG. 2, the sandwich structure sandwiching the EL layer 510 needs to be covered by a protection film in order to prolong the service life of the EL element 600. Then, such a protection film has to be prepared independently from the process of manufacturing the transparent member 540 to increase the number of total manufacturing steps and baffle effects for reducing the manufacturing cost.

SUMMARY OF THE INVENTION

In view of the above identified circumstances, it is therefore the object of the present invention to provide a display device that is free from the problems of the conventional technology and adapted to highly efficiently take out light emitted from the EL layers thereof to the outside, while it can be manufactured at low cost.

According to the invention, the above object is achieved by providing a display device comprising:

a transparent substrate;

a plurality of electroluminescent elements arranged on the transparent substrate, each of the electroluminescent elements being formed by sequentially laying a transparent electrode, an electroluminescent layer and a reflector electrode on the transparent substrate;

transparent members having a profile of a frustum of pyramid or cone and respectively covering the electroluminescent elements; and reflection films formed respectively on the surfaces of the transparent members.

In another aspect of the invention, there is also provided a display device comprising:

a transparent substrate;

a plurality of electroluminescent elements arranged on the transparent substrate, each of the electroluminescent elements being formed by sequentially laying a transparent electrode, an electroluminescent layer and a reflector electrode on the transparent substrate;

transparent members respectively covering the electroluminescent elements, each of the transparent members partly having a curved surface showing a positive curvature, a part thereof held in contact with the transparent substrate having a curved surface showing a negative curvature; and reflection films formed respectively on the surfaces of the transparent members.

DESCRIPTION OF THE PREFERRED EMBODIMENTS

Now, the present invention will be described by referring to the accompanying drawings that illustrate preferred embodiments of the invention.

Figure 1:
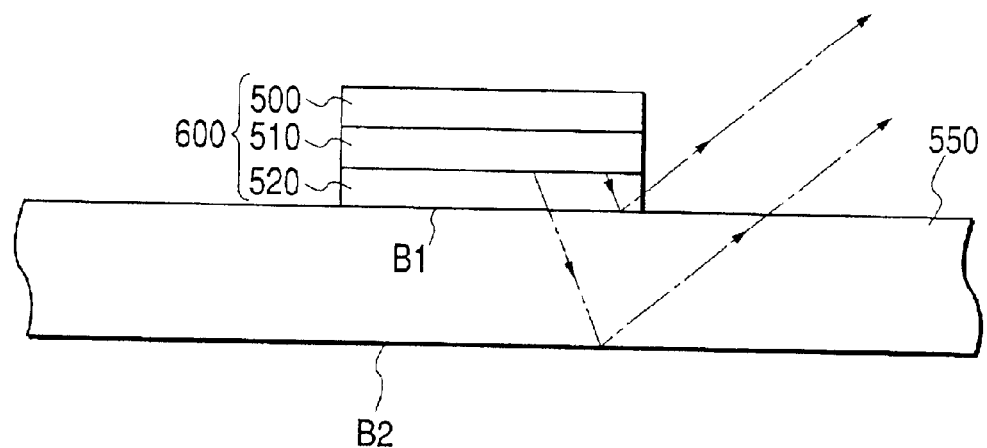
FIG. 1 is a schematic cross sectional view of a known EL element.
Figure 2:
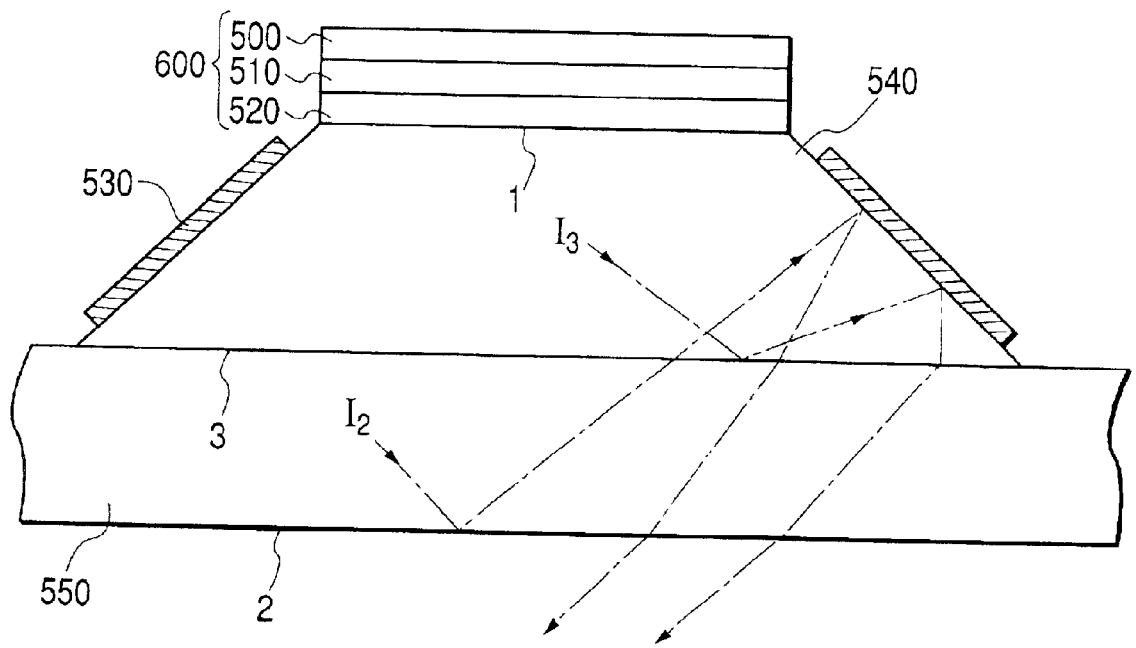
FIG. 2 is a schematic cross sectional view of another known EL element.
Figure 3:
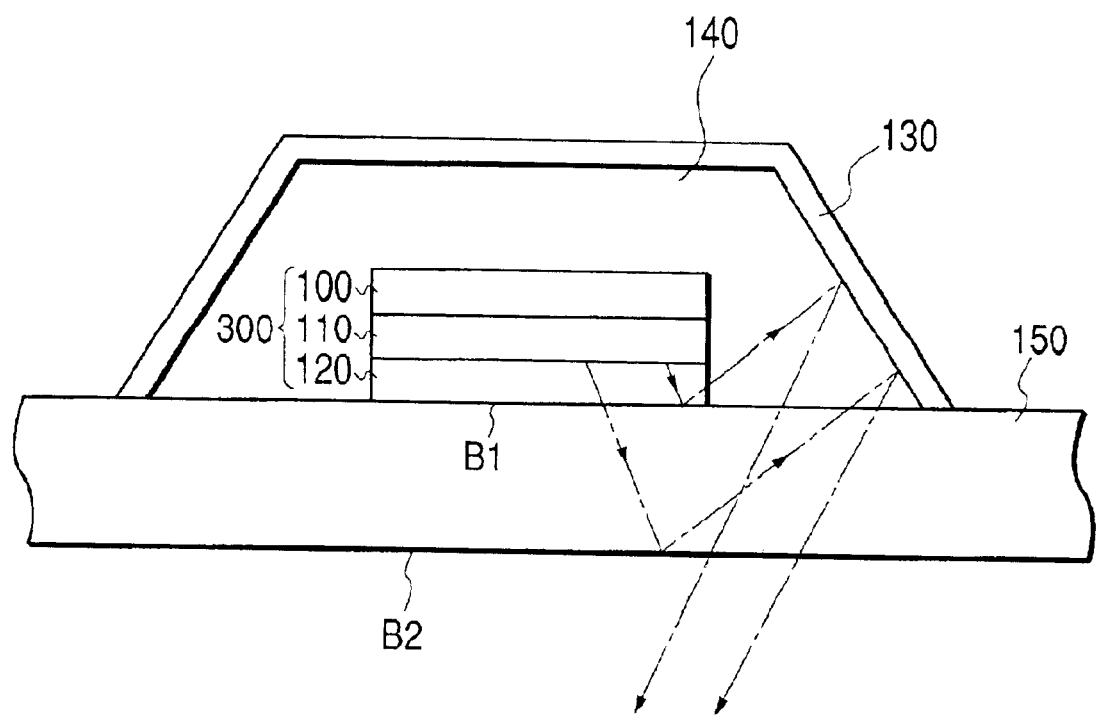
FIG. 3 is a schematic cross sectional view of an electroluminescent element operating as a pixel in the first embodiment of a display device according to the invention.

FIG. 3 is a schematic cross sectional view of an electroluminescent (EL) element operating as a pixel in the first embodiment of display device according to the invention. Referring to FIG. 3, the EL element 300 is formed by sequentially laying a transparent electrode 120, an electroluminescent (EL) layer 110 and a reflector electrode 100 on a transparent substrate 150 in the above mentioned order. Additionally, a transparent member 140 having a trapezoidal cross section is formed on the transparent substrate 150 to cover the EL element 300. In other words, the EL element 300 is protected from ambient air by the transparent member 140. A reflection film 130 is formed as coat on the entire surface of the transparent member 140.

The EL layer 110 of the EL element shown in FIG. 3 emits light as a voltage is applied between the reflector electrode 100 and the transparent electrode 120. Light emitted from the EL layer 110 is mostly transmitted through the transparent electrode 120 and the transparent substrate 150 and externally taken out.

On the other hand, a part of light emitted from the EL layer 110 is totally reflected by the interface B1 of the transparent electrode 120 and the transparent substrate 150. The totally reflected light is reflected by the reflection film 130 and transmitted through the transparent substrate 150 before it is externally taken out. While the totally reflected light is refracted twice by the interface B1 and the interface B2, it is shown in FIG. 3 as if it proceeds straight for the purpose of simplicity.

Another part of light emitted from the EL layer 110 is refracted by the interface B1 and totally reflected by the interface B2 of the transparent substrate 150 and ambient air. However, the totally reflected light is also reflected by the reflection film 130 and transmitted through the transparent substrate 150 before it is externally taken out. In this way, light emitted from the EL element 300 is highly efficiently taken out to the outside.

While a single EL element is shown in FIG. 3, a plurality of identical EL elements are arranged two-dimensionally in the embodiment of the display device. When the EL elements are arranged two-dimensionally, the transparent members are typically realized in the form of a frustum of quadrangular pyramid.

Now, the process of manufacturing EL elements will be described by referring to FIGS. 4A through 4D. FIGS. 4A through 4D are partial schematic cross sectional views of the embodiment of display device of FIG. 3, illustrating some of the EL elements in different manufacturing steps.

Figure 4A:
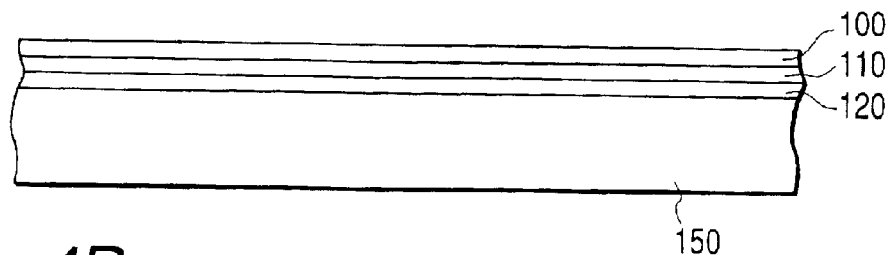
FIGS. 4A, 4B, 4C and 4D are partial schematic cross sectional views of the embodiment of the display device of FIG. 3, illustrating different manufacturing steps.

Firstly, as shown in FIG. 4A, a transparent electrode 120 typically made of ITO, an EL layer 110 made of an organic or inorganic material and a reflector electrode 100 made of metal film are sequentially formed on a transparent substrate 150 typically made of glass or plastic in the above mentioned order.

Figure 4B:
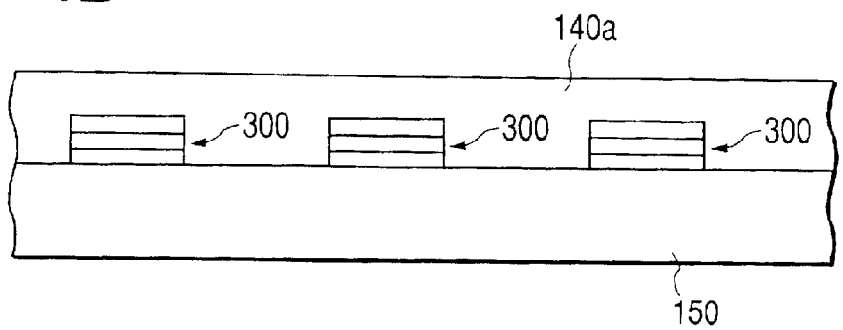

Then, the electrodes and the EL layer are removed by pattern etching except the necessary areas to produce EL elements 300 arranged in a manner as shown in FIG. 4B. Then, a transparent layer 140a is formed to cover the EL elements 300. The transparent layer 140a is typically made of titanium oxide.

Figure 4C:
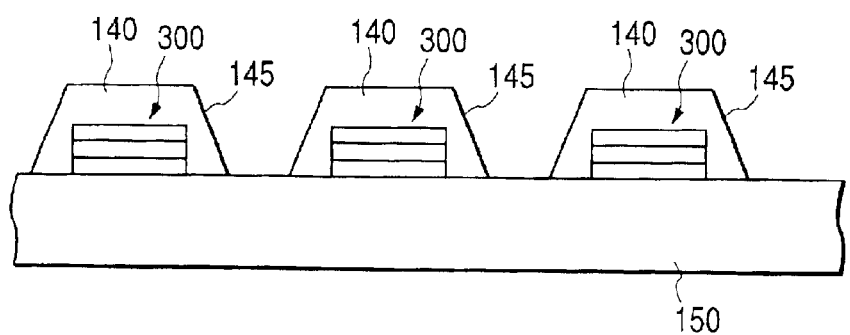

Subsequently, the transparent layer 140a is partly removed by pattern etching to produce a plurality of transparent members 140, each having slopes 145 as shown in FIG. 4C, to completely cover the respective EL elements 300.

Figure 4D:
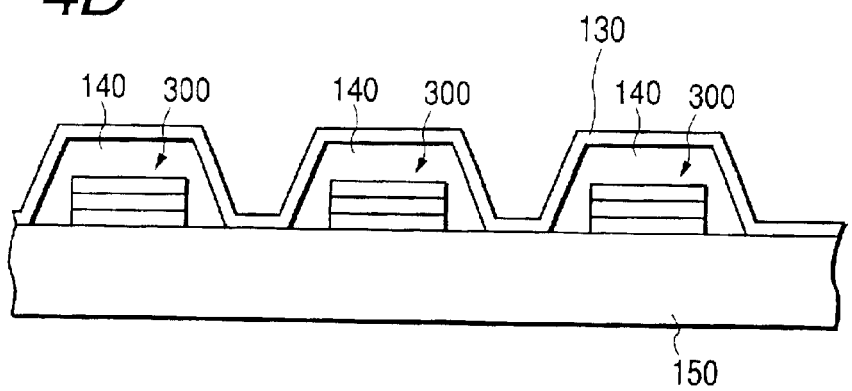

Finally, as shown in FIG. 4D, a reflection film 130 of metal or dielectric is formed on the entire surface of the transparent substrate 150 by deposition. In this way, a display device comprising a plurality of EL elements 300 formed on a transparent substrate is manufactured.

Figure 5:
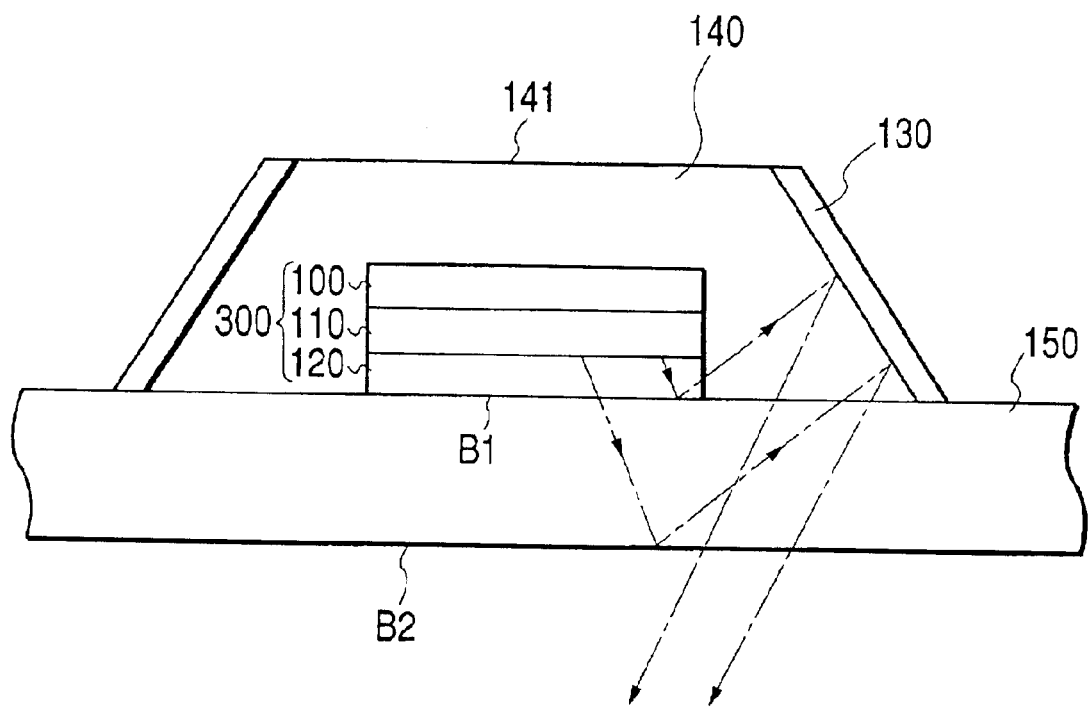
FIG. 5 is a schematic cross sectional view of an electroluminescent element operating as a pixel in the second embodiment of the display device according to the invention.

FIG. 5 is a schematic cross sectional view of an electroluminescent (EL) element operating as a pixel in the second embodiment of display device according to the invention. This embodiment differs from the first embodiment only in that the reflection film 130 is formed only on the slopes of the transparent members 140. In other words, no reflection film is formed on the top surface 141 of the transparent members 140. Otherwise, the second embodiment is same and identical with the first embodiment. Therefore, in FIG. 5, the components that are same as or similar to those of FIG. 3 are denoted respectively by the same reference symbols and will not be described any further.

Referring to FIG. 5, in this embodiment again, a part of light emitted from the EL layer 110 is totally reflected by the interface B1 of the transparent electrode 120 and the transparent substrate 150. The totally reflected light is then reflected by the reflection film 130 and transmitted through the transparent substrate 150 before it is taken out into ambient air. While the light totally reflected by the reflection film 130 is refracted twice by the interface B1 and the interface B2, it is shown in FIG. 5 as if it proceeds straight for the purpose of simplicity. Since no reflection film is formed on the top surface 141 of the transparent member 140, this embodiment provides an advantage that heat emitted with light can be easily dissipated if compared with the first embodiment.

The second embodiment of display device is produced by removing the reflection film that has been formed on the entire surface of the transparent members 140 as shown in FIG. 4D from the top surfaces 141 thereof by photo-etching after the manufacturing steps shown in FIGS. 4A through 4D and described above by referring to the first embodiment.

Figure 6A:
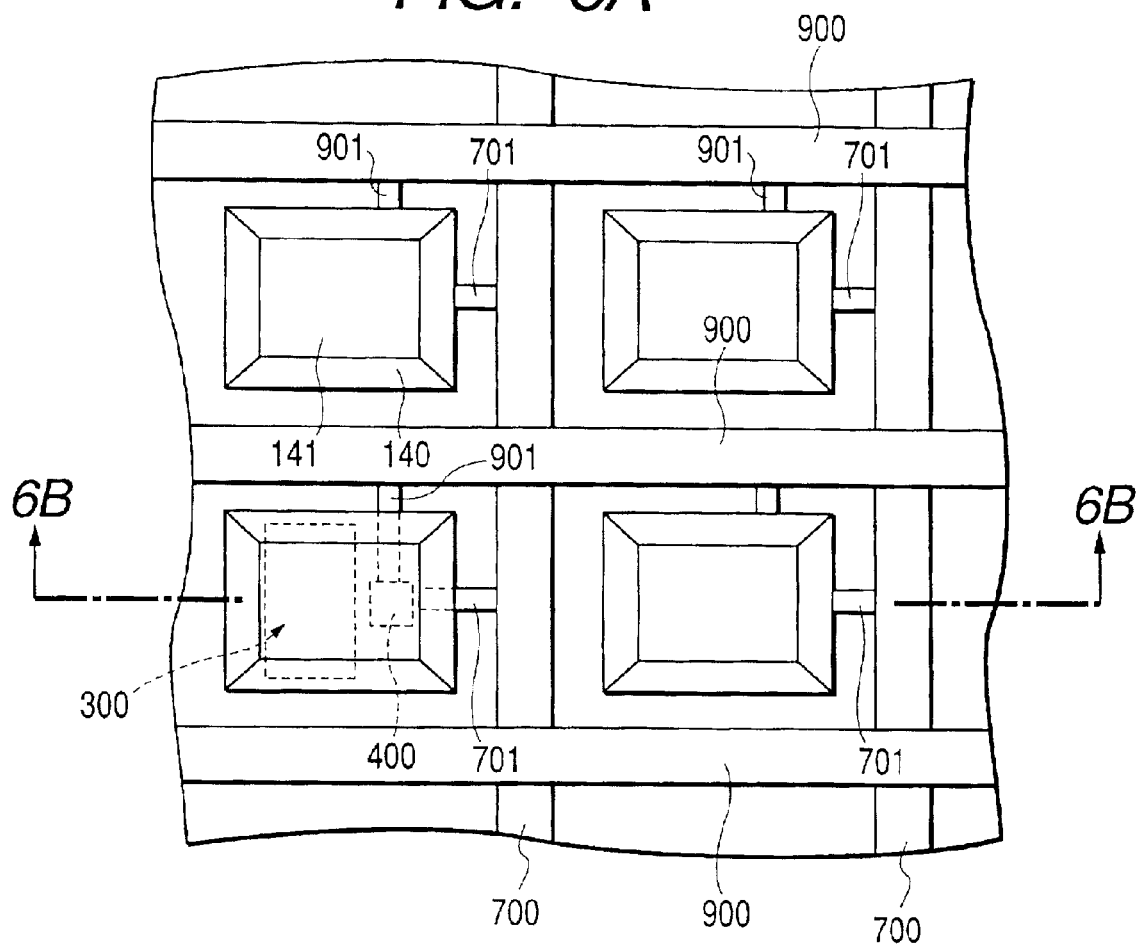
FIGS. 6A and 6B are a partial schematic plan view and a corresponding partial schematic cross sectional view of the third embodiment of the display device according to the invention.
Figure 6B:
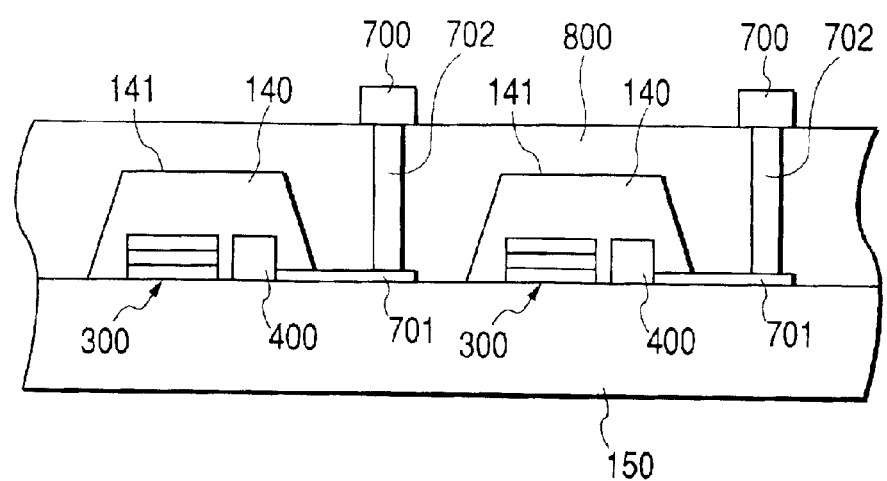

FIGS. 6A and 6B are a partial schematic plan view and a corresponding partial schematic cross sectional view of the third embodiment of display device according to the invention. FIG. 6A is a partial schematic plan view and FIG. 6B is a schematic cross sectional view taken along line 6B-6B in FIG. 6A. In FIGS. 6A and 6B, the components that are same as or similar to those of FIGS. 3 through 5 are denoted respectively by the same reference symbols and will not be described any further.

In this embodiment, each EL element 300 and a corresponding drive element 400 such as TFT for driving the EL element 300 are covered by a transparent member 140. Note that the wires between each element 300 and the corresponding drive element 400, which may be a TFT, are not shown in FIGS. 6A and 6B for the purpose of simplicity. Each transparent member 140 is realized in the form of a frustum of quadrangular prism having a top surface 141. Therefore, each transparent member 140 shows a trapezoidal cross section. Although not shown in FIG. 6B, the surfaces of the transparent members 140 are covered by a reflection film as shown in FIG. 3 or FIG. 5.

In this embodiment, the gaps separating the plurality of transparent members 140 that are covered by a reflection film are filled with an insulating body 800 and row-directional wires 900 and column-directional wires 700 are formed on the insulating body 800. The drive element 400 connected to each EL element 300 is by turn connected to a column-directional wire 700 by way of an outgoing wire 701. The outgoing wire 701 and the column-directional wire 700 are connected by way of a through hole 702 through the insulating body 800. Similarly, the drive element 400 connected to each element 300 is also connected to a row-directional wire 900 by way of an outgoing wire 901. With the above described arrangement, the EL elements 300 of this embodiment of display device emit light as so many pixels of a two-dimensional display screen.

While each EL element 300 of FIGS. 6A and 6B is connected to a column-directional wire 700 and a row-directional wire 900 by way of a corresponding drive element 400, alternatively it may be directly connected to the wires without a drive element 400 interposed between them. While the transparent members have a profile of a frustum of quadrangular pyramid in the above description, they may alternatively have a profile of a frustum of cone. Still alternatively, the transparent members may have a profile of a part of a ball.

Figure 7:
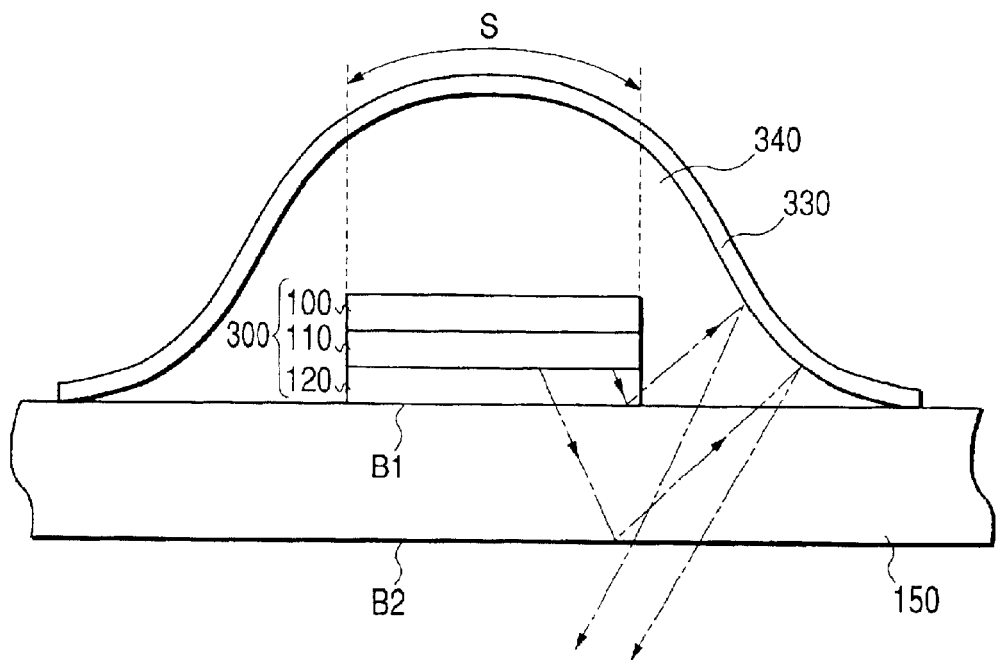
FIG. 7 is a schematic cross sectional view of an electroluminescent element operating as a pixel in the fourth embodiment of the display device according to the invention.

FIG. 7 is a schematic cross sectional view of an electroluminescent (EL) element operating as a pixel in the fourth embodiment of display device according to the invention. In FIG. 7, the components that are same as or similar to those of FIG. 3 are denoted respectively by the same reference symbols and will not be described any further.

In this embodiment, the transparent members 340 are so formed as to show a profile of a part of a ball. More specifically, each transparent member 340 has a top section that shows a profile of a part of a ball with a positive curvature and a bottom section, or an outskirt section, that is connected to the transparent substrate 150 and shows a profile of a curved slope with a negative curvature. In other words, the transparent member 340 has a convex top section and a concave outskirt section. Then, the surface of each transparent member 340 is covered by a reflection film 330. The reflection film 330 operates as a concave mirror for the EL element 300.

Each transparent member 340 may be formed by causing a drop of hot and molten plastic to fall onto the corresponding EL element 300 and subsequently solidifying the molten plastic. The inclination of the outskirt section is determined as a function of the contact angle of the transparent substrate 150 and the liquefied transparent member 340. The inclination of the outskirt section may be controlled by pressing the semispherical transparent member 340 from the top before the latter is solidified.

In the EL element shown in FIG. 7, the EL layer 110 emits light when a voltage is applied between the reflector electrode 100 and the transparent electrode 120. Light emitted from the EL layer 110 is transmitted through the transparent electrode 120 and the transparent substrate 150 before it is externally taken out.

On the other hand, a part of light emitted from the EL layer 110 is totally reflected by the interface B1 of the transparent electrode 120 and the transparent substrate 150. The totally reflected light is reflected by the reflection film 330 and transmitted through the transparent substrate 150 before it is taken out into ambient air. While the totally reflected light is refracted twice by the interface B1 and the interface B2, it is shown in FIG. 7 as if it proceeds straight for the purpose of simplicity.

Another part of light emitted from the EL layer 110 is refracted by the interface B1 and totally reflected by the interface B2 of the transparent substrate 150 and ambient air. However, the totally reflected light is also reflected by the reflection film 330 and transmitted through the transparent substrate 150 before it is taken out into ambient air.

Almost no light gets to the top section S of the transparent member 340. Rays of light proceeding substantially perpendicularly relative to the end facets of the EL element 300 are not totally reflected by the interface B1 but transmitted through the transparent substrate 150 and taken out into ambient air. Thus, if the top section S is not accurately semispherical but distorted somewhat, it does not significantly affect the function of the EL element 300. In this way, light emitted from the EL element 300 is highly efficiently taken out to the outside.

Figure 8:
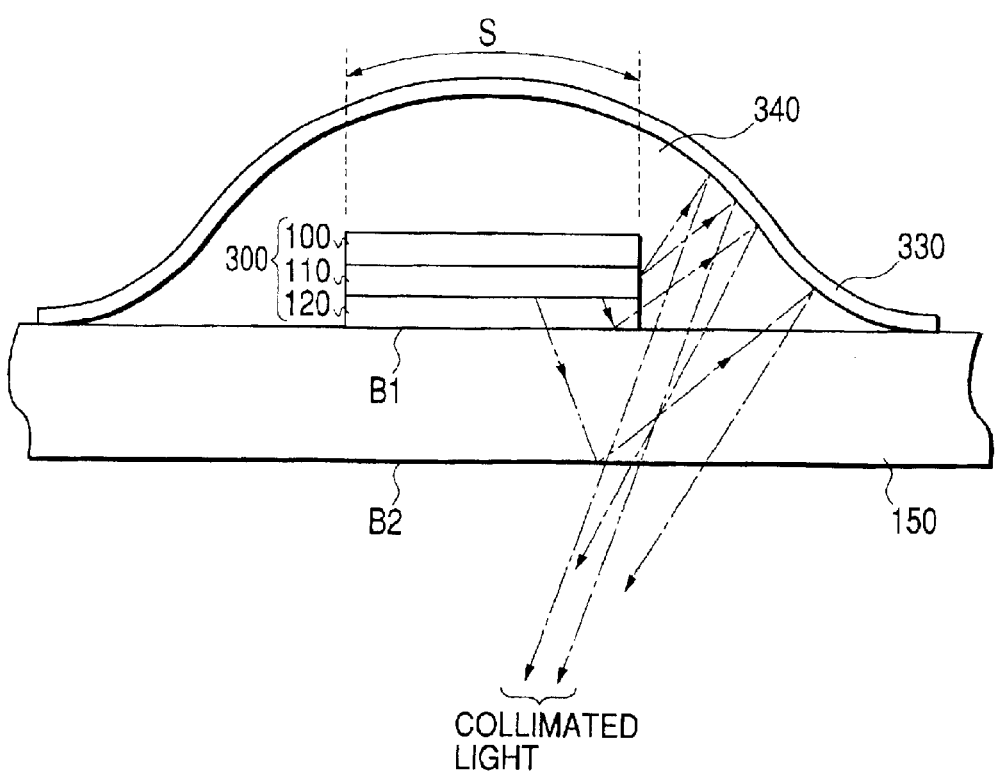
FIG. 8 is a schematic cross sectional view of an electroluminescent element operating as a pixel in the fifth embodiment of the display device according to the invention.

FIG. 8 is a schematic cross sectional view of an electroluminescent (EL) element operating as a pixel in the fifth embodiment of display device according to the invention. This embodiment differs from the above described fourth embodiment only in that the focal plane of the concave mirror formed by the reflection film 330 is located inside the element EL element 300. Otherwise, this embodiment is identical with the fourth embodiment. Therefore, in FIG. 8, the components that are same as or similar to those of FIG. 7 are denoted respectively by the same reference symbols and will not be described any further.

In this embodiment, rays of light emitted from the end facets of the EL layer 110 are reflected by the concave mirror section of the transparent member 340 to form a flux of parallel rays of light, which is then taken out to the outside through the transparent substrate 150. In the outskirt section of the transparent member 340, all the light reflected by the interfaces B1, B2 is reflected again before it is externally taken out into ambient air. Thus, light is externally taken out to a large proportion.

In this embodiment again, almost no light gets to the top section S of the transparent member 340. Rays of light proceeding substantially perpendicularly relative to the end facets of the EL element 300 are not totally reflected by the interface B1 but transmitted through the transparent substrate 150 and taken out into ambient air. Thus, if the top section S is not accurately semispherical but distorted somewhat, it does not significantly affect the function of the EL element 300.

While the outskirt section of the transparent member 340 is realized in the form of a curved surface with a negative curvature (concave surface) in either of the embodiments shown in FIGS. 7 and 8, an effect similar to that of FIG. 7 or 8 can be obtained when the transparent member 340 is made to show a profile having no such concave surface, or a profile of a part of a ball such as a semispherical profile having only a positive curvature.

Figure 9:
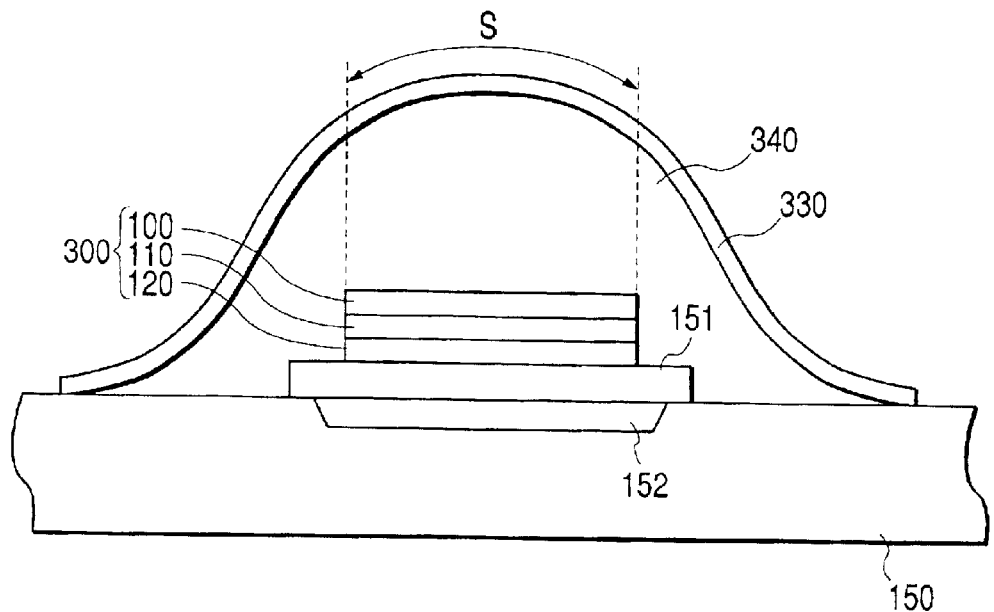
FIG. 9 is a schematic cross sectional view of an electroluminescent element operating as a pixel in the sixth embodiment of the display device according to the invention.

FIG. 9 is a schematic cross sectional view of an electroluminescent (EL) element operating as a pixel in the sixth embodiment of display device according to the invention. In FIG. 9, the components that are same as or similar to those of FIG. 7 are denoted respectively by the same reference symbols and will not be described any further.

In this embodiment, the transparent substrate 150 is provided with grooves 152, each having a size sufficiently covering an EL element 300. A thin transparent plate 151 typically made of titanium oxide ($TiO_2$) is formed on the groove 152. An EL element 300 is formed on the transparent plate 151. In other words, the inside of the groove 152 is a void and an air gap is formed between the transparent plate 151 and the substrate 150.

In this embodiment, light from the EL element 300 that is transmitted through transparent plate 151 and the groove 152 containing a void therein and strikes the substrate 150 is not totally reflected by the substrate 150. In other words, totally reflected light in the transparent substrate 150 will not be propagated into other pixels nor confined within the substrate 150. Therefore, light emitted from the EL element 300 is effectively taken out into ambient air by the reflector hemisphere formed by the transparent member 340 and the reflection film 330.

While the transparent member 340 has a profile of a part of a ball in FIG. 9, it may be replaced by a transparent member 140 having a profile of a frustum of quadrangular pyramid as shown in FIG. 3 or that of a frustum of cone.

Meanwhile, it may be conceivable to form a low refractive index film such as a silica aerogel film on the transparent substrate of a display device according to the invention in order to improve the efficiency of taking out light from the transparent substrate. Such arrangements will be discussed below.

Figure 10:
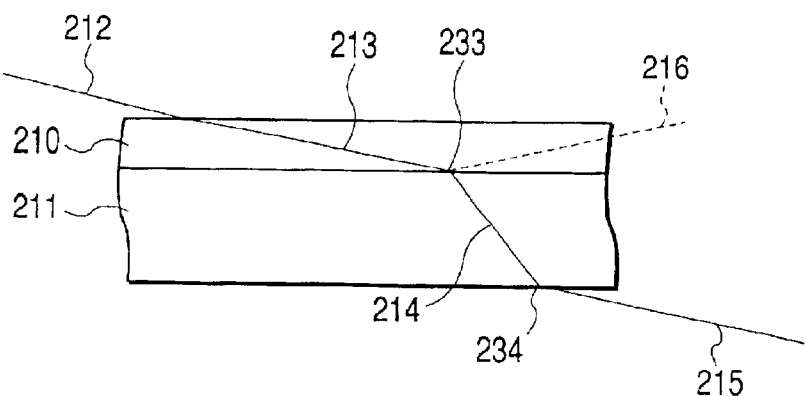
FIG. 10 is a partial cross sectional view of a silica aerogel film formed on a transparent substrate.

FIG. 10 is a partial cross sectional view of a silica aerogel film 210 formed on a transparent substrate 211. Such a silica aerogel film 210 typically shows a refractive index of 1.03. Light 212 striking the silica aerogel film 210 from air is refracted by the interface of the silica aerogel film 210 and the transparent substrate 211 according to the Snell's law of refraction to become light 214. Light 214 is then emitted into air from the lower surface 234 of the transparent substrate 211 as light 215. Since the transparent substrate 211 is sandwiched between substances having respective refractive indexes that are lower than the refractive index of itself, no total reflection takes place in the transparent substrate 211. However, light 213 is reflected in the direction of regular reflection as a result of Fresnel reflection at the interface 233 to give rise to light 216. The intensity of light 216 increases as the angle of incidence of light 213 is reduced to become quasi-parallel relative to the transparent substrate 211.

Figure 11:
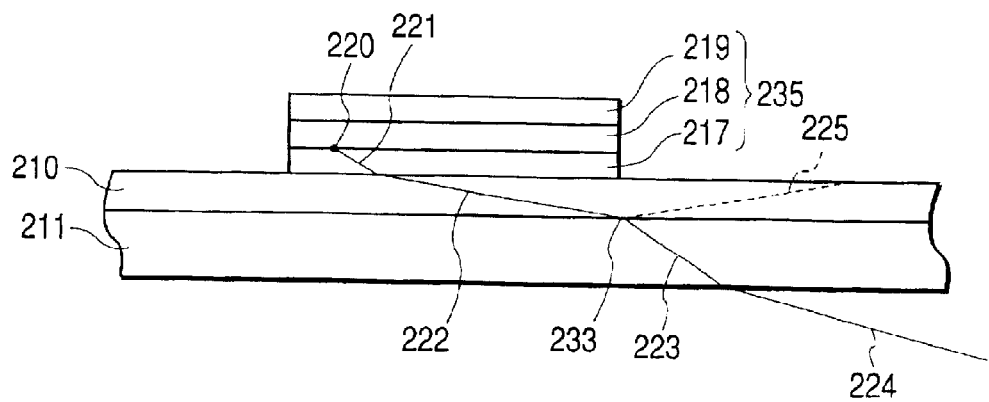
FIG. 11 is a schematic cross sectional view of an electroluminescent element formed on a transparent substrate carrying a silica aerogel film formed thereon.

FIG. 11 is a schematic cross sectional view of an electroluminescent (EL) element 235 formed on a transparent substrate 211 carrying a silica aerogel film 210 formed thereon. In FIG. 11, the components that are same as or similar to those of FIG. 10 are denoted respectively by the same reference symbols and will not be described any further.

Referring to FIG. 11, the EL element 235 is formed by sequentially laying a transparent electrode 217 typically made of ITO, an EL layer 218 made of an organic or inorganic material and a reflector electrode 219 made of metal are sequentially formed on a silica aerogel film 210 in the above mentioned order. Light 221 emitted from point 220 of the EL layer 218 is transmitted through the transparent electrode 217 and the silica aerogel film 210 to get to the interface 233 of the silica aerogel film 210 and the transparent substrate 211. Then, light 225 produced as a result of Fresnel reflection at the interface 233 is then propagated in the silica aerogel film 210 in the direction of regular reflection. The propagated light then goes into adjacent EL elements (not shown) and is randomly reflected by them before proceeding in the direction of observation. Thus, the propagated light that goes into adjacent EL elements can give rise to undesired noise in the latter. Additionally, the propagated light 225 constitutes a loss of light for the EL element from which it originates to consequently reduce the efficiency of effectively utilizing light.

Figure 12:
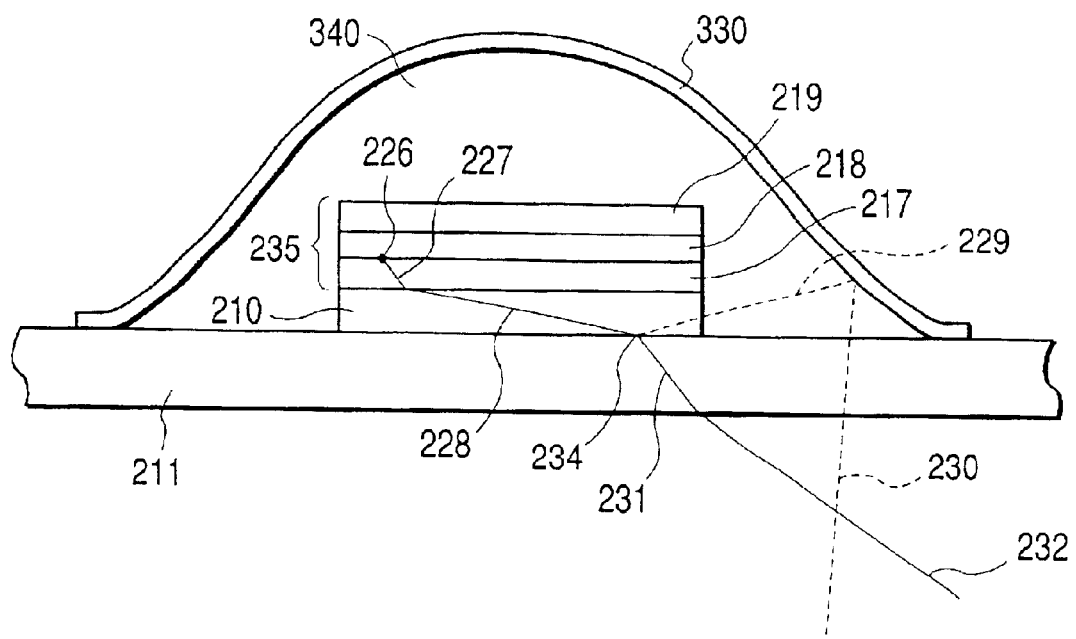
FIG. 12 is a schematic cross sectional view of an electroluminescent element having a silica aerogel film formed on a transparent substrate and operating as a pixel in the seventh embodiment of display device according to the invention.

FIG. 12 is a schematic cross sectional view of an electroluminescent element having a silica aerogel film formed on a transparent substrate and operating as a pixel in the seventh embodiment of display device according to the invention. In FIG. 12, the components that are same as or similar to those of FIGS. 7 and 11 are denoted respectively by the same reference symbols and will not be described any further.

In this embodiment, the silica aerogel film 210 has a size substantially same as that of the EL element 235. Light 227 emitted from point 226 of the EL layer 218 undergoes Fresnel reflection at the interface 234 of the silica aerogel film 210 and the transparent substrate 211 to become light 229, which is then reflected by the reflection film 330 formed on the surface of transparent member 340 to become light 230 that goes into air. Therefore, light that undergoes Fresnel reflection does not go into adjacent EL elements (not shown) nor totally reflected in the transparent substrate 211 to consequently raise the efficiency of utilization of light of this embodiment.

Figure 13:
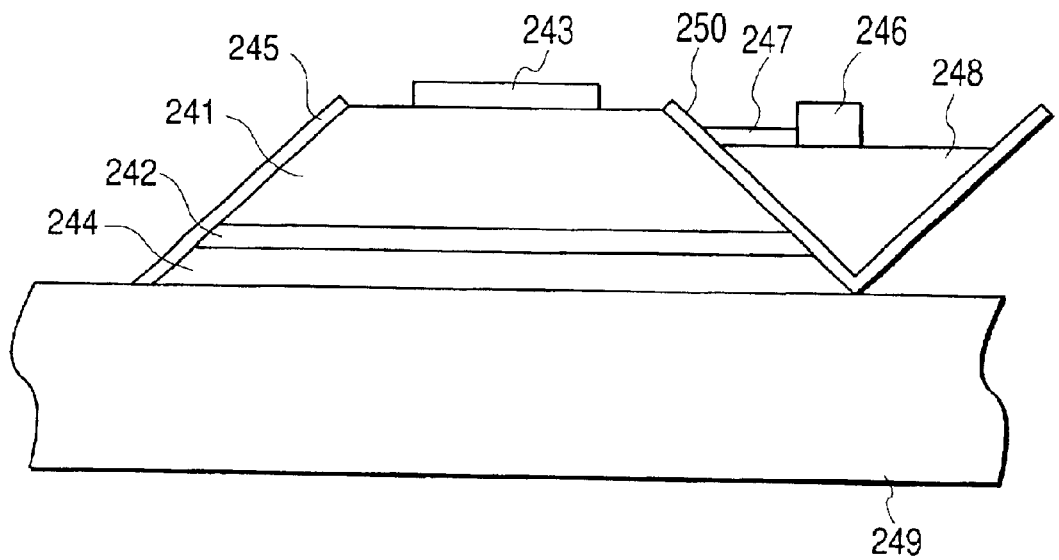
FIG. 13 is a schematic cross sectional view of an electroluminescent element having a low refractive index light transmitting film formed on a transparent substrate and operating as a pixel in the eighth embodiment of the display device according to the invention.

FIG. 13 is a schematic cross sectional view of an electroluminescent (EL) element having a low refractive index light transmitting film formed on a transparent substrate and operating as a pixel in the eighth embodiment of display device according to the invention.

Referring to FIG. 13, an insulating member is buried between any two adjacent electroluminescent (EL) elements in this embodiment. In FIG. 13, there are shown an EL layer 241, a transparent electrode 242 typically made of ITO, a reflector electrode 243 typically made of metal film, a low refractive index light transmitting film 244 typically made of silica aerogel, a reflection film 245, electrically conductive members 250 and 247, a thin film transistor (TFT) 246, a transparent substrate 249 typically made of glass and an insulating member 248 typically made of plastic such as polyimide and buried between the EL element and an adjacent EL element.

Figure 14:
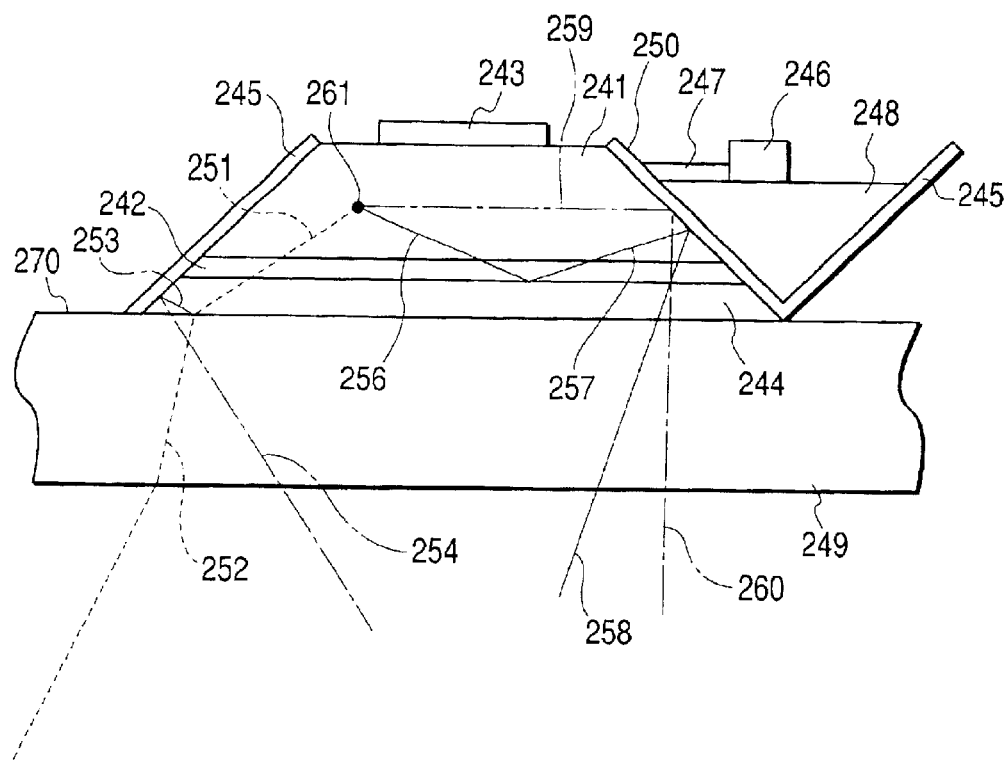
FIG. 14 is schematic cross sectional view similar to FIG. 13 but illustrating the behavior of rays of light in the electroluminescent element.

FIG. 14 is a schematic cross sectional view similar to FIG. 13 but illustrating the behavior of rays of light in the electroluminescent element. In FIG. 14, the components that are same as or similar to those of FIG. 13 are denoted respectively by the same reference symbols and will not be described any further.

Referring to FIG. 14, light 251 emitted from point 261 of the EL layer 241 directly strikes the top surface 270 of the transparent substrate 249 and goes into air as refracted light 252. On the other hand, light 256 emitted also from the point 261 is totally reflected by the interface of the transparent electrode 242 and the low refractive index light transmitting film 244 to become light 257, which is then reflected by the electrically conductive metal member 250 and goes into air as light 258. Finally, light 259 emitted from the point 261 and transmitted through the inside of the EL layer 241 is reflected by the electrically conductive metal film 250 formed on the slopes and goes into air as light 260. Note that a slight gap (not shown) is formed between the electrically conductive metal film 250 and the reflection film 245 of an adjacent EL element so that they may not contact each other at the apex of the triangle formed by them.

Meanwhile, in a display apparatus according to the invention, light emitted from each EL element is amplified when the EL layer comprising a hole/electron transport layer and the corresponding transparent electrode (anode) are sandwiched between a pair of mirrors and the light path length between the mirrors is made equal to the wavelength of light emitted from the EL layer to introduce the structure of a resonator into the EL element. Then, amplified light can be taken out by arranging a half mirror between the transparent substrate and the transparent electrode. Such an arrangement will be discussed below.

In the above described arrangement, the extent of increase G of the intensity of light emitted in a direction perpendicular to the transparent substrate depends on the reflectances of the mirrors, or the reflectance Rc of the reflection electrode (cathode) and the reflectance Rh of the half mirror and expressed by formula (1) below, which is shown in Monthly Display, October, 1998, p. 107.

$$G=(1+(Rc)^{1/2})^2 \cdot (1-Rh)/(1-(Rc \cdot Rh)^{1/2})^2 \qquad (1)$$

If Rc is 90% and Rh is 0%, the value of G is 3.8 times greater than that of an ordinary EL element that does not have the structure of a resonator. If Rc is 90% and Rh is 85%, the value of G is 9.5 times greater than that of an EL element where Rc is 90% and Rh is 0%.

Additionally, the value of G can be raised or lowered depending on the values of Rc and Rh. Therefore, a very bright display screen can be realized by introducing such a structure into a display device. When such a display device is placed in a light place, the viewers may feel it difficult to view the displayed image if the value of Rh is made large because both background light and room light are reflected. However, if such a display device is used in a dark place for a projector, neither background light nor room light give rise to any reflection problem. Therefore, the luminance of the image projected on a display screen by a projector can be increased when EL elements and half mirrors are combined to increase the intensity of light emitted in a direction perpendicular to the transparent substrate and the effect of the increased intensity of light and that of the increase in the quantity of light due to the transparent members and the reflection films as obtained in a display device according to the invention are combined.

Figure 15:
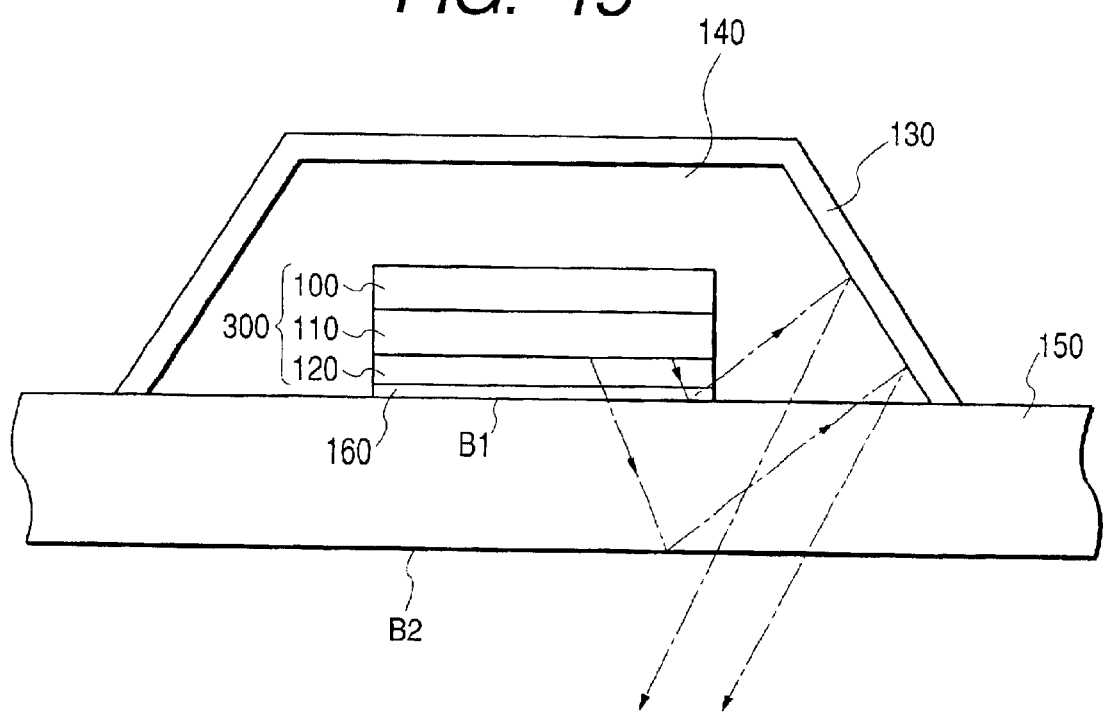
FIG. 15 is a schematic cross sectional view of an electroluminescent element having a half mirror formed on a transparent substrate and operating as a pixel in the ninth embodiment of the display device according to the invention.

FIG. 15 is a schematic cross sectional view of an electroluminescent (EL) element having a half mirror formed on a transparent substrate and operating as a pixel in the ninth embodiment of display device according to the invention. This embodiment differs from the first embodiment only in that a half mirror 160 is arranged between the transparent electrode 120 of each EL element and the transparent substrate 150. Otherwise, this embodiment is same and identical with the first embodiment. Therefore, in FIG. 15, the components that are same as or similar to those of FIG. 3 are denoted respectively by the same reference symbols and will not be described any further.

In this embodiment, the light path length between the reflector electrode 100 and the half mirror 160 is made equal to a half of the wavelength of light emitted from the EL element 300. Thus, these components form a resonator so that light can be taken out with an increased intensity. In this embodiment again, light totally reflected by the interfaces B1 and B2 is reflected by the reflection film 130 and emitted to the outside by way of the transparent substrate 150 to provide the advantage of increasing the efficiency of utilization of light as in the first embodiment.

Figure 16:
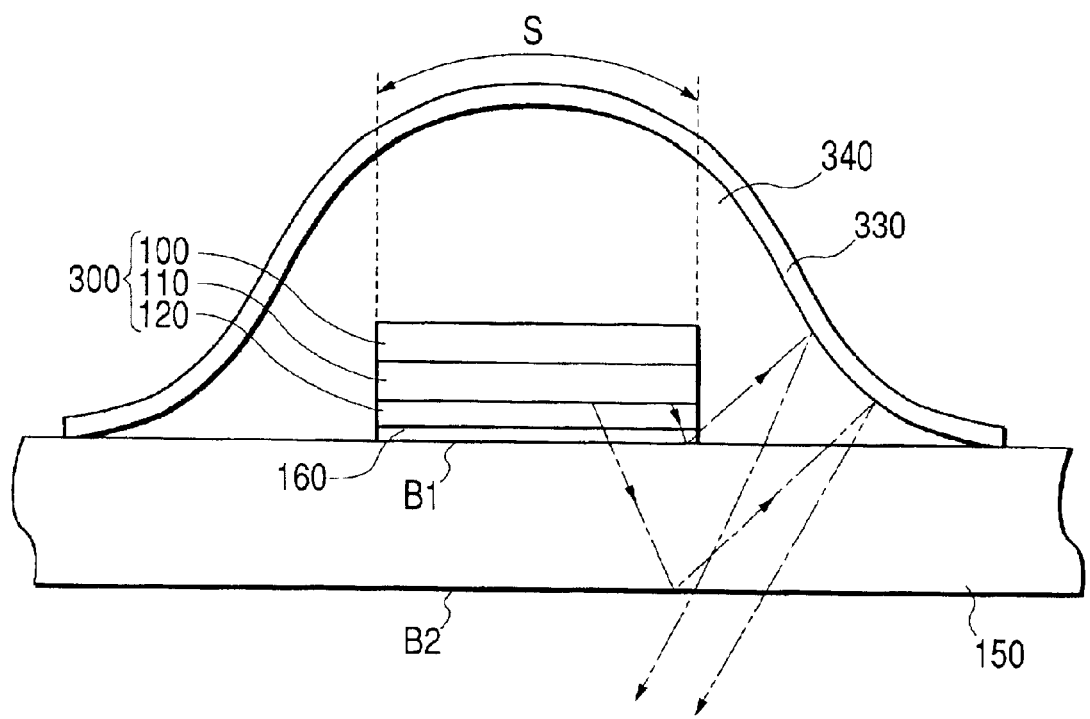
FIG. 16 is a schematic cross sectional view of an electroluminescent element having a half mirror formed on a transparent substrate and operating as a pixel in the tenth embodiment of the display device according to the invention.

FIG. 16 is a schematic cross sectional view of an electroluminescent (EL) element having a half mirror formed on a transparent substrate and operating as a pixel in the tenth embodiment of display device according to the invention. This embodiment differs from the fourth embodiment only in that a half mirror 160 is arranged between the transparent electrode 120 of each EL element and the transparent substrate 150. Otherwise, this embodiment is same and identical with the fourth embodiment. Therefore, in FIG. 16, the components that are same as or similar to those of FIG. 7 are denoted respectively by the same reference symbols and will not be described any further.

In this embodiment, the light path length between the reflector electrode 100 and the half mirror 160 is made equal to a half of the wavelength of light emitted from the EL element 300. Thus, these components form a resonator so that light can be taken out with an increased intensity. In this embodiment again, light totally reflected by the interfaces B1 and B2 is reflected by the reflection film 330 and emitted to the outside by way of the transparent substrate 150 to provide the advantage of increasing the efficiency of utilization of light as in the fourth embodiment.

Figure 17:
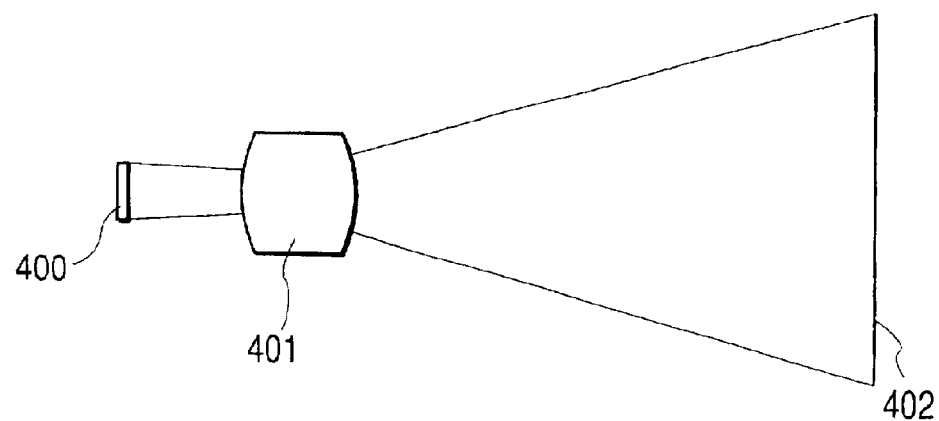
FIG. 17 is a conceptual illustration of a projector realized by using a display device shown in FIG. 15 or FIG. 16.

The ninth and tenth embodiments can suitably be used for projectors for the above described reason. FIG. 17 is a conceptual illustration of a projector realized by using a display device shown in FIG. 15 or FIG. 16. In FIG. 17, reference symbol 400 denotes a display device comprising EL elements having a configuration as shown in FIG. 15 or FIG. 16. The image of the display device 400 is projected onto a display screen 402 by way of a projection lens 401. With this arrangement, the projected image is by far brighter than the image produced by any comparable known system.

Referring to FIG. 15 and FIG. 16, the half mirror 160 typically has a four-layered structure of $TiO_2$ layer/$SiO_2$ layer/$TiO_2$ layer/$SiO_2$ layer. When the central wavelength of light emitted from the EL element is $\lambda$, the light path length of each of the layers is equal to $\lambda/4$. In the above described arrangement, the end $SiO_2$ layer is directly formed on the transparent substrate 150 by deposition.

Alternatively, the half mirror 160 may have a well known structure formed by repeatedly laying a pair of layers of $TiO_2$ layer/$SiO_2$ layer. With such an arrangement again, the end $SiO_2$ layer is directly formed on the transparent substrate 150 by deposition.

Figure 18:
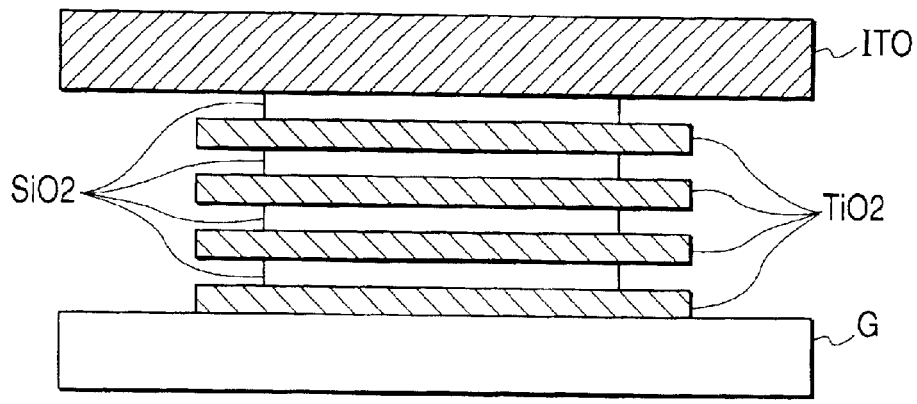
FIG. 18 is a schematic cross sectional view of a half mirror structure having eight layers.

FIG. 18 is a schematic cross sectional view of a half mirror structure having eight layers realized by arranging four pairs of $TiO_2$ layer/$SiO_2$ layer. In FIG. 18, the layer denoted by ITO corresponds to the transparent electrode 120 in FIG. 15 or FIG. 16 and the layer denoted by G corresponds to the transparent substrate 150 in FIG. 15 or FIG. 16. Table 1 below shows some of the details of the films of the half mirror.

TABLE 1

| | | $\lambda$ = 600 nm | |
|---|---|---|---|
| No. | mat. | n | d (nm) |
| 0 | G | 1.46 | |
| 1 | $SiO_2$ | 1.485217 | 85 |
| 2 | $TiO_2$ | 2.298664 | 72 |
| 3 | $SiO_2$ | 1.485217 | 92 |
| 4 | $TiO_2$ | 2.298664 | 82 |
| 5 | $SiO_2$ | 1.485217 | 81 |
| 6 | $TiO_2$ | 2.298664 | 45 |
| 7 | $SiO_2$ | 1.485217 | 25 |
| 8 | $TiO_2$ | 2.298664 | 51 |
| 9 | ITO | 1.9 | |

Figure 19:
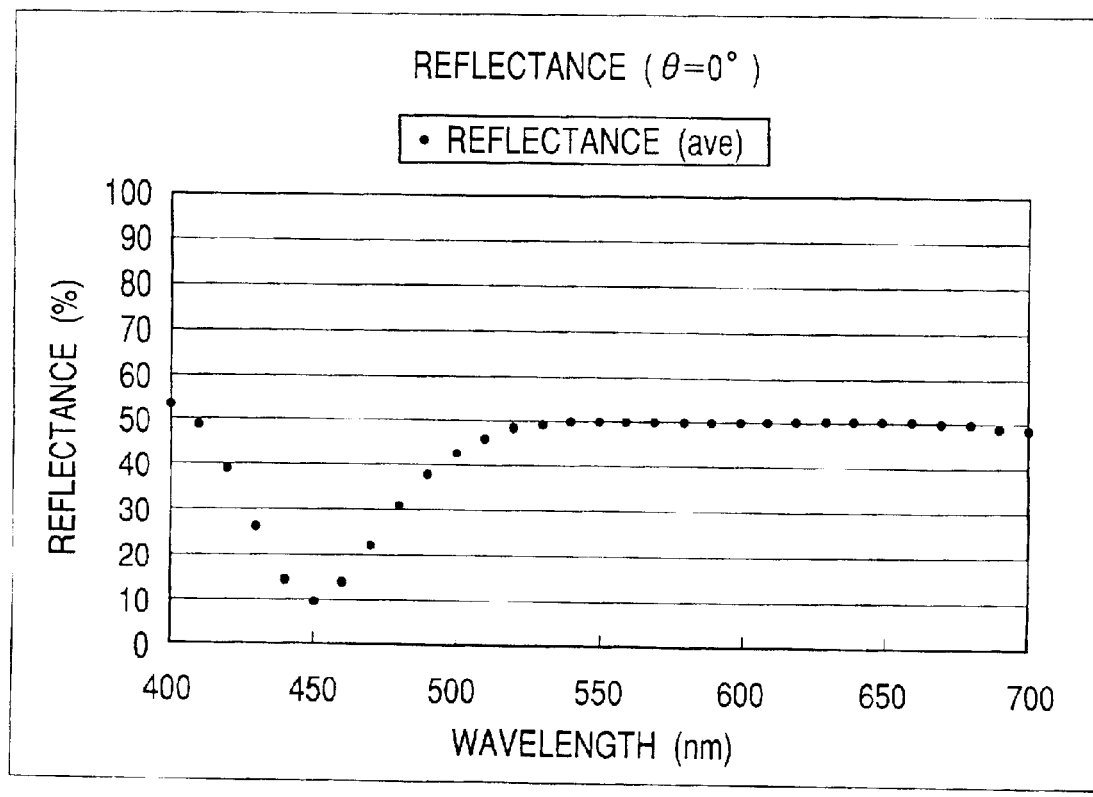
FIG. 19 is a graph illustrating the reflectance of the half mirror structure of FIG. 18.

FIG. 19 is a graph illustrating the reflectance of the above described half mirror structure of eight layers relative to light perpendicularly striking the half mirror.

Figure 20A:
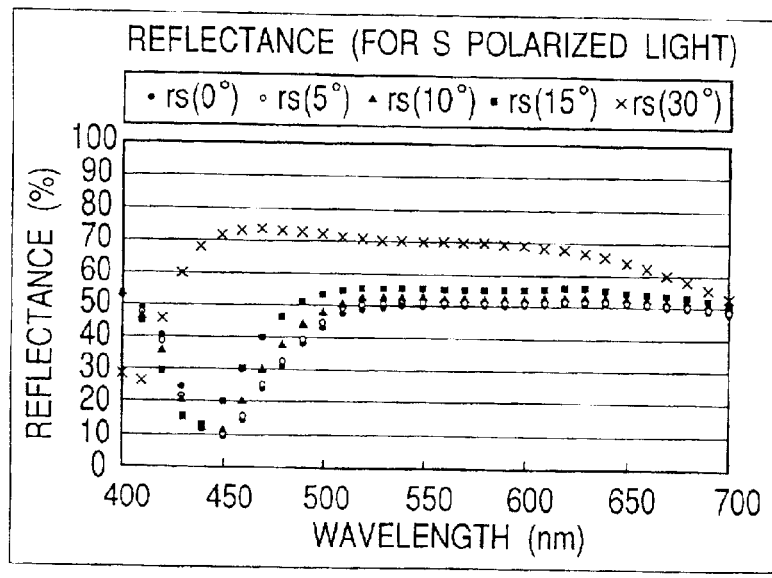
FIGS. 20A, 20B and 20C are graphs illustrating the reflectance of a half mirror structure having eight layers in different aspects.
Figure 20B:
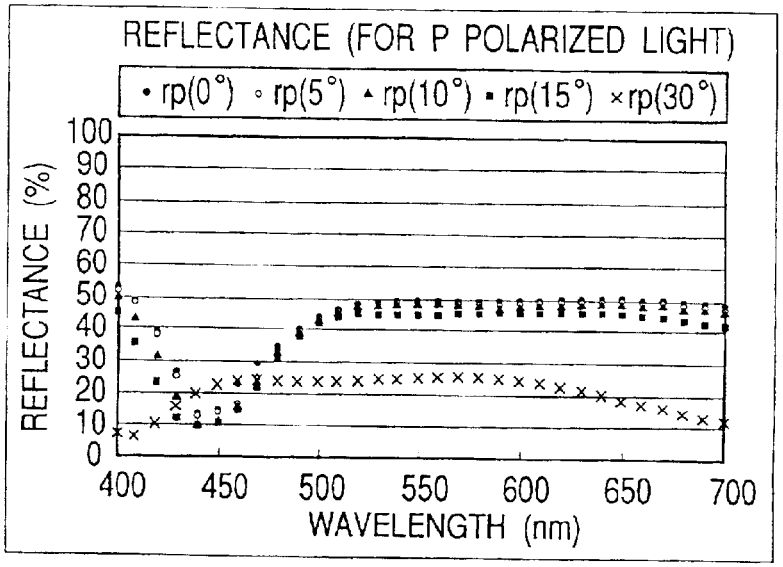
Figure 20C:
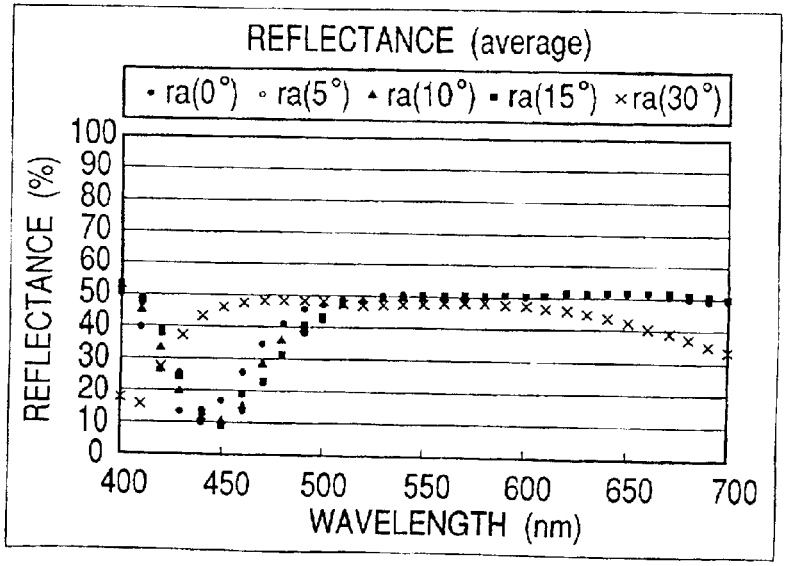

FIGS. 20A through 20C are graphs illustrating the reflectance of a half mirror structure having eight layers in different aspects. FIG. 20A is a graph illustrating the reflectance of the above described half mirror structure having eight layers for S polarized light with a wavelength range between 400 nm and 700 nm and a range of angle of incidence within 30°. FIG. 20B is a graph illustrating the reflectance of the above described half mirror structure having eight layers for P polarized light with a wavelength range between 400 nm and 700 nm and a range of angle of incidence within 30°. FIG. 20C is a graph illustrating the average reflectance of the above described half mirror structure having eight layers for light with a wavelength range between 400 nm and 700 nm and a range of angle of incidence within 30°, or {(reflectance for S polarized light)+ (reflectance for P polarized light)}/2.

Table 2 below shows the reflectance, the transmittance and the phases of reflected wave and transmitted wave of the above described half mirror structure having eight layers for light with an angle of incidence of 0°.

TABLE 2

| | | Reflectance | | | Transmittance | | | Phase | | | |
|---|---|---|---|---|---|---|---|---|---|---|---|
| theta | wl | (s) rs | (p) rp | (av) ra | (s) ts | (p) tp | (av) ta | (rs) prs-deg | (rp) prp-deg | (ts) pst-deg | (tp) ptp-deg |
| 0 | 400 | 53.08212 | 53.08212 | 53.08212 | 46.91788 | 46.91788 | 46.91788 | 185.682 | 185.682 | 111.147 | 111.147 |
| 0 | 410 | 48.17657 | 48.17657 | 48.17657 | 51.82343 | 51.82343 | 51.82343 | 199.928 | 199.928 | 142.852 | 142.852 |
| 0 | 420 | 39.00835 | 39.00835 | 39.00835 | 60.99165 | 60.99165 | 60.99165 | 214.67 | 214.67 | 171.521 | 171.521 |
| 0 | 430 | 26.21536 | 26.21536 | 26.21536 | 73.78464 | 73.78464 | 73.78464 | 227.604 | 227.604 | 199.797 | 199.797 |
| 0 | 440 | 14.30588 | 14.30588 | 14.30588 | 85.69412 | 85.69412 | 85.69412 | 232.298 | 232.298 | 228.568 | 228.568 |
| 0 | 450 | 9.693069 | 9.693069 | 9.693069 | 90.30693 | 90.30693 | 90.30693 | 220.31 | 220.31 | 256.921 | 256.921 |
| 0 | 460 | 13.8806 | 13.8806 | 13.8806 | 86.1194 | 86.1194 | 86.1194 | 210.327 | 210.327 | 283.124 | 283.124 |
| 0 | 470 | 22.45843 | 22.45843 | 22.45843 | 77.54157 | 77.54157 | 77.54157 | 215.223 | 215.223 | 306.185 | 306.185 |
| 0 | 480 | 31.06662 | 31.06662 | 31.06662 | 68.93338 | 68.93338 | 68.93338 | 226.654 | 226.654 | 326.221 | 326.221 |
| 0 | 490 | 37.91265 | 37.91265 | 37.91265 | 62.08735 | 62.08735 | 62.08735 | 240.139 | 240.139 | 343.856 | 343.856 |
| 0 | 500 | 42.79684 | 42.79684 | 42.79684 | 57.20316 | 57.20316 | 57.20316 | 254.308 | 254.308 | 359.734 | 359.734 |
| 0 | 510 | 46.04912 | 46.04912 | 46.04912 | 53.95088 | 53.95088 | 53.95088 | 268.788 | 268.788 | 14.359 | 14.359 |
| 0 | 520 | 48.07543 | 48.07543 | 48.07543 | 51.92457 | 51.92457 | 51.92457 | 283.493 | 283.493 | 28.083 | 28.083 |
| 0 | 530 | 49.23057 | 49.23057 | 49.23057 | 50.76943 | 50.76943 | 50.76943 | 298.4 | 298.4 | 41.143 | 41.143 |
| 0 | 540 | 49.80049 | 49.80049 | 49.80049 | 50.19951 | 50.19951 | 50.19951 | 313.475 | 313.475 | 53.686 | 53.686 |
| 0 | 550 | 50.00978 | 50.00978 | 50.00978 | 49.99022 | 49.99022 | 49.99022 | 328.653 | 328.653 | 65.797 | 65.797 |
| 0 | 560 | 50.02995 | 50.02995 | 50.02995 | 49.97005 | 49.97005 | 49.97005 | 343.833 | 343.833 | 77.517 | 77.517 |
| 0 | 570 | 49.98419 | 49.98419 | 49.98419 | 50.01581 | 50.01581 | 50.01581 | 358.889 | 358.889 | 88.857 | 88.857 |

TABLE 2-continued

| | | Reflectance | | | Transmittance | | | Phase | | | |
|---|---|---|---|---|---|---|---|---|---|---|---|
| theta | wl | (s) rs | (p) rp | (av) ra | (s) ts | (p) tp | (av) ta | (rs) prs-deg | (rp) prp-deg | (ts) pst-deg | (tp) ptp-deg |
| 0 | 580 | 49.95105 | 49.95105 | 49.95105 | 50.04895 | 50.04895 | 50.04895 | 13.685 | 13.685 | 99.813 | 99.813 |
| 0 | 590 | 49.96959 | 49.96959 | 49.96959 | 50.03041 | 50.03041 | 50.03041 | 28.089 | 28.089 | 110.374 | 110.374 |
| 0 | 600 | 50.04673 | 50.04673 | 50.04673 | 49.95327 | 49.95327 | 49.95327 | 41.992 | 41.992 | 120.53 | 120.53 |
| 0 | 610 | 50.16668 | 50.16668 | 50.16668 | 49.83332 | 49.83332 | 49.83332 | 55.313 | 55.313 | 130.276 | 130.276 |
| 0 | 620 | 50.30027 | 50.30027 | 50.30027 | 49.69973 | 49.69973 | 49.69973 | 68.003 | 68.003 | 139.615 | 139.615 |
| 0 | 630 | 50.41309 | 50.41309 | 50.41309 | 49.58691 | 49.58691 | 49.58691 | 80.044 | 80.044 | 148.557 | 148.557 |
| 0 | 640 | 50.47114 | 50.47114 | 50.47114 | 49.52886 | 49.52886 | 49.52886 | 91.442 | 91.442 | 157.12 | 157.12 |
| 0 | 650 | 50.44449 | 50.44449 | 50.44449 | 49.55551 | 49.55551 | 49.55551 | 102.225 | 102.225 | 165.326 | 165.326 |
| 0 | 660 | 50.30878 | 50.30878 | 50.30878 | 49.69122 | 49.69122 | 49.69122 | 112.43 | 112.43 | 173.199 | 173.199 |
| 0 | 670 | 50.04538 | 50.04538 | 50.04538 | 49.95462 | 49.95462 | 49.95462 | 122.101 | 122.101 | 180.768 | 180.768 |
| 0 | 680 | 49.64119 | 49.64119 | 49.64119 | 50.35881 | 50.35881 | 50.35881 | 131.287 | 131.287 | 188.059 | 188.059 |
| 0 | 690 | 49.0876 | 49.0876 | 49.0876 | 50.9124 | 50.9124 | 50.9124 | 140.035 | 140.035 | 195.098 | 195.098 |
| 0 | 700 | 48.37985 | 48.37985 | 48.37985 | 51.62015 | 51.62015 | 51.62015 | 148.392 | 148.392 | 201.911 | 201.911 |

Table 3 below shows the reflectance of the above described half mirror structure having eight layers for S polarized light with a wavelength range between 400 nm and 700 nm, and a range of angle of incidence within 30°.

Table 4 below shows the reflectance of the above described half mirror structure having eight layers for S polarized light with a wavelength range between 400 nm and 700 nm and a range of angle of incidence within 30°.

TABLE 3

| theta wl | 0 rs(0°) | 5 rs(5°) | 10 rs(10°) | 15 rs(15°) | 20 rs(20°) | 25 rs(25°) | 30 rs(30°) |
|---|---|---|---|---|---|---|---|
| 400 | 53.08212 | 53.3949 | 54.12334 | 54.48678 | 52.68927 | 45.05927 | 28.26013 |
| 410 | 48.17657 | 48.0306 | 47.21124 | 44.43833 | 37.23653 | 24.06525 | 26.01796 |
| 420 | 39.00835 | 38.22824 | 35.44011 | 29.42095 | 19.95582 | 18.17546 | 45.26679 |
| 430 | 26.21536 | 24.98771 | 21.19834 | 15.57016 | 14.30957 | 31.02331 | 59.49687 |
| 440 | 14.30588 | 13.43388 | 11.59921 | 12.37497 | 23.11551 | 45.36075 | 67.03681 |
| 450 | 9.693069 | 10.04325 | 12.33233 | 20.02936 | 35.63604 | 54.95319 | 70.74039 |
| 460 | 13.8806 | 15.35109 | 20.54906 | 30.85611 | 45.51777 | 60.55814 | 72.33646 |
| 470 | 22.45843 | 24.35017 | 30.22547 | 39.9916 | 52.03934 | 63.59624 | 72.73219 |
| 480 | 31.06662 | 32.88383 | 38.22425 | 46.44271 | 56.006 | 65.04069 | 72.45333 |
| 490 | 37.91265 | 39.47661 | 43.95743 | 50.6249 | 58.23293 | 65.50564 | 71.85011 |
| 500 | 42.79684 | 44.09124 | 47.75917 | 53.15198 | 59.31593 | 65.40039 | 71.17301 |
| 510 | 46.04912 | 47.11221 | 50.11556 | 54.53563 | 59.6761 | 65.01588 | 70.5896 |
| 520 | 48.07543 | 48.95622 | 51.45082 | 55.16329 | 59.61919 | 64.56017 | 70.18505 |
| 530 | 49.23057 | 49.97527 | 52.0999 | 55.32672 | 59.36993 | 64.16882 | 69.97028 |
| 540 | 49.80049 | 50.44935 | 52.32197 | 55.24517 | 59.08617 | 63.90939 | 69.90289 |
| 550 | 50.00978 | 50.59664 | 52.3144 | 55.07728 | 58.86468 | 63.79144 | 69.91378 |
| 560 | 50.02995 | 50.58197 | 52.22066 | 54.92683 | 58.74761 | 63.78334 | 69.92978 |
| 570 | 49.98419 | 50.5215 | 52.13468 | 54.84791 | 58.73335 | 63.8316 | 69.88688 |
| 580 | 49.95105 | 50.48664 | 52.10589 | 54.8533 | 58.79092 | 63.8771 | 69.73522 |
| 590 | 49.96959 | 50.50974 | 52.14688 | 54.92587 | 58.87459 | 63.86576 | 69.43871 |
| 600 | 50.04673 | 50.59212 | 52.24333 | 55.03077 | 58.93546 | 63.75335 | 68.97219 |
| 610 | 50.16668 | 50.71388 | 52.36478 | 55.12621 | 58.92895 | 63.50638 | 68.31834 |
| 620 | 50.30027 | 50.84343 | 52.47397 | 55.17116 | 58.81831 | 63.10088 | 67.46499 |
| 630 | 50.41309 | 50.94525 | 52.53369 | 55.12983 | 58.5754 | 62.52028 | 66.40318 |
| 640 | 50.47114 | 50.98534 | 52.51087 | 54.97339 | 58.17983 | 61.75344 | 65.12588 |
| 650 | 50.44449 | 50.93435 | 52.37858 | 54.6802 | 57.61763 | 60.79313 | 63.62755 |
| 660 | 50.30878 | 50.76881 | 52.11629 | 54.23494 | 56.8798 | 59.63484 | 61.90393 |
| 670 | 50.04538 | 50.47107 | 51.70927 | 53.62746 | 55.96098 | 58.2761 | 59.95224 |
| 680 | 49.64119 | 50.0289 | 51.14787 | 52.85181 | 54.85879 | 56.7164 | 57.77195 |
| 690 | 49.0876 | 49.43447 | 50.4264 | 51.90519 | 53.57301 | 54.95695 | 55.36522 |
| 700 | 48.37985 | 48.68366 | 49.54245 | 50.78745 | 52.1055 | 53.00111 | 52.73804 |

TABLE 4

| theta wl | 0 rp(0°) | 5 rp(5°) | 10 rp(10°) | 15 rp(15°) | 20 rp(20°) | 25 rp(25°) | 30 rp(30°) |
|---|---|---|---|---|---|---|---|
| 400 | 53.08212 | 52.41265 | 50.11352 | 45.19735 | 35.91914 | 21.38051 | 7.714678 |
| 410 | 48.17657 | 47.0462 | 43.25155 | 35.67732 | 23.52558 | 10.47469 | 6.09405 |
| 420 | 39.00835 | 37.32218 | 31.98673 | 22.77523 | 12.0694 | 7.138141 | 10.295 |
| 430 | 26.21536 | 24.31187 | 18.8981 | 11.84362 | 8.091181 | 11.22493 | 15.63376 |
| 440 | 14.30588 | 13.04836 | 10.26356 | 8.979772 | 12.20714 | 17.95092 | 19.73183 |
| 450 | 9.693069 | 9.706433 | 10.6241 | 14.08498 | 19.74767 | 23.95304 | 22.1791 |
| 460 | 13.8806 | 14.77373 | 17.64994 | 22.30504 | 26.88842 | 28.21266 | 23.30821 |
| 470 | 22.45843 | 23.49275 | 26.33542 | 29.93909 | 32.27244 | 30.82653 | 23.60357 |
| 480 | 31.06662 | 31.84632 | 33.79384 | 35.73271 | 35.86257 | 32.20508 | 23.49964 |
| 490 | 37.91265 | 38.35183 | 39.29464 | 39.68754 | 38.02603 | 32.77816 | 23.31682 |
| 500 | 42.79684 | 42.93243 | 43.01936 | 42.17475 | 39.17749 | 32.90971 | 23.24601 |
| 510 | 46.04912 | 45.94468 | 45.36773 | 43.59799 | 39.67931 | 32.87423 | 23.36023 |
| 520 | 48.07543 | 47.79115 | 46.72505 | 44.30494 | 39.82129 | 32.85165 | 23.64426 |
| 530 | 49.23057 | 48.81779 | 47.41154 | 44.57511 | 39.81848 | 32.93333 | 24.03153 |
| 540 | 49.80049 | 49.30242 | 47.68153 | 44.62272 | 39.81271 | 33.13805 | 24.43688 |
| 550 | 50.00978 | 49.46244 | 47.73026 | 44.60017 | 39.87867 | 33.43479 | 24.77926 |
| 560 | 50.02995 | 49.46219 | 47.69869 | 44.60206 | 40.03564 | 33.76629 | 24.99371 |
| 570 | 49.98419 | 49.41716 | 47.67725 | 44.67203 | 40.26349 | 34.0683 | 25.03518 |
| 580 | 49.95105 | 49.39789 | 47.71136 | 44.81339 | 40.51962 | 34.28204 | 24.87747 |
| 590 | 49.96959 | 49.4358 | 47.80998 | 45.00217 | 40.75334 | 34.36063 | 24.51025 |
| 600 | 50.04673 | 49.53148 | 47.95609 | 45.19974 | 40.9159 | 34.27074 | 23.93544 |
| 610 | 50.16668 | 49.66448 | 48.11768 | 45.3632 | 40.96618 | 33.9918 | 23.16418 |
| 620 | 50.30027 | 49.80294 | 48.25693 | 45.45234 | 40.8728 | 33.51408 | 22.2142 |
| 630 | 50.41309 | 49.91129 | 48.33689 | 45.43338 | 40.61411 | 32.83644 | 21.10787 |
| 640 | 50.47114 | 49.95562 | 48.32522 | 45.28025 | 40.17702 | 31.96444 | 19.87064 |
| 650 | 50.44449 | 49.90677 | 48.19603 | 44.97455 | 39.55558 | 30.90882 | 18.52991 |
| 660 | 50.30878 | 49.74154 | 47.93003 | 44.50458 | 38.74951 | 29.68432 | 17.11396 |
| 670 | 50.04538 | 49.44257 | 47.51391 | 43.8641 | 37.76299 | 28.30877 | 15.65106 |
| 680 | 49.64119 | 48.99798 | 46.93955 | 43.05153 | 36.60391 | 26.80261 | 14.1688 |
| 690 | 49.0876 | 48.4003 | 46.20294 | 42.06877 | 35.28305 | 25.18815 | 12.69317 |
| 700 | 48.37985 | 47.64581 | 45.3035 | 40.92075 | 33.81384 | 23.48918 | 11.24807 |

Table 5 below shows the average reflectance of the above described half mirror structure having eight layers for light with a wavelength range between 400 nm and 700 nm and a range of angle of incidence within 30°, or {(reflectance for S polarized light)+(reflectance for P polarized light)}/2.

TABLE 5

| theta wl | 0 ra(0°) | 5 ra(5°) | 10 ra(10°) | 15 ra(15°) | 20 ra(20°) | 25 ra(25°) | 30 ra(30°) |
|---|---|---|---|---|---|---|---|
| 400 | 53.08212 | 52.90377 | 52.11843 | 49.84207 | 44.30421 | 33.21989 | 17.9874 |
| 410 | 48.17657 | 47.5384 | 45.2314 | 40.05782 | 30.38105 | 17.26997 | 16.056 |
| 420 | 39.00835 | 37.77521 | 33.71342 | 26.09809 | 16.01261 | 12.6568 | 27.7809 |
| 430 | 26.21536 | 24.64979 | 20.04822 | 13.70689 | 11.20038 | 21.12412 | 37.56531 |
| 440 | 14.30588 | 13.24112 | 10.93139 | 10.67737 | 17.66133 | 31.65583 | 43.38432 |
| 450 | 9.693069 | 9.874841 | 11.47822 | 17.05717 | 27.69186 | 39.45311 | 46.45974 |
| 460 | 13.8806 | 15.06241 | 19.0995 | 26.58057 | 36.20309 | 44.3854 | 47.82233 |
| 470 | 22.45843 | 23.92146 | 28.28045 | 34.96535 | 42.15589 | 47.21139 | 48.16788 |
| 480 | 31.06662 | 32.36507 | 36.00905 | 41.08771 | 45.93428 | 48.62288 | 47.97648 |
| 490 | 37.91265 | 38.91422 | 41.62603 | 45.15622 | 48.12948 | 49.1419 | 47.58346 |
| 500 | 42.79684 | 43.51183 | 45.38926 | 47.66336 | 49.24671 | 49.15505 | 47.20951 |
| 510 | 46.04912 | 46.52845 | 47.74164 | 49.06681 | 49.67771 | 48.94506 | 46.97491 |
| 520 | 48.07543 | 48.37368 | 49.08793 | 49.73411 | 49.72024 | 48.70591 | 46.91465 |
| 530 | 49.23057 | 49.39653 | 49.75572 | 49.95092 | 49.5942 | 48.55107 | 47.00091 |
| 540 | 49.80049 | 49.87589 | 50.00175 | 49.93394 | 49.44944 | 48.52372 | 47.16988 |
| 550 | 50.00978 | 50.02954 | 50.02233 | 49.83873 | 49.37168 | 48.61311 | 47.34652 |
| 560 | 50.02995 | 50.02208 | 49.95967 | 49.76445 | 49.39162 | 48.77482 | 47.46174 |
| 570 | 49.98419 | 49.96933 | 49.90597 | 49.75997 | 49.49842 | 48.94995 | 47.46103 |
| 580 | 49.95105 | 49.94226 | 49.90863 | 49.83334 | 49.65527 | 49.07957 | 47.30635 |
| 590 | 49.96959 | 49.97277 | 49.97843 | 49.96402 | 49.81396 | 49.1132 | 46.97448 |
| 600 | 50.04673 | 50.0618 | 50.09971 | 50.11525 | 49.92568 | 49.01204 | 46.45381 |
| 610 | 50.16668 | 50.18918 | 50.24123 | 50.24471 | 49.94756 | 48.74909 | 45.74126 |
| 620 | 50.30027 | 50.32318 | 50.36545 | 50.31175 | 49.84555 | 48.30748 | 44.8396 |
| 630 | 50.41309 | 50.42827 | 50.43529 | 50.28161 | 49.59476 | 47.67836 | 43.75552 |
| 640 | 50.47114 | 50.47048 | 50.41805 | 50.12682 | 49.17843 | 46.85894 | 42.49826 |
| 650 | 50.44449 | 50.42056 | 50.2873 | 49.82738 | 48.58661 | 45.85097 | 41.07873 |
| 660 | 50.30878 | 50.25518 | 50.02316 | 49.36976 | 47.81466 | 44.65958 | 39.50894 |
| 670 | 50.04538 | 49.95682 | 49.61159 | 48.74578 | 46.86198 | 43.29243 | 37.80165 |

TABLE 5-continued

| theta wl | 0 ra(0°) | 5 ra(5°) | 10 ra(10°) | 15 ra(15°) | 20 ra(20°) | 25 ra(25°) | 30 ra(30°) |
| --- | --- | --- | --- | --- | --- | --- | --- |
| 680 | 49.64119 | 49.51344 | 49.04371 | 47.95167 | 45.73135 | 41.75951 | 35.97038 |
| 690 | 49.0876 | 48.91739 | 48.31467 | 46.98698 | 44.42803 | 40.07255 | 34.0292 |
| 700 | 48.37985 | 48.16473 | 47.42298 | 45.8541 | 42.95967 | 38.24515 | 31.99305 |

As shown above, the reflectance of the above described half mirror having eight layers is substantially constant and about 50% for visible light with a range of angle of incidence within 30°. According to the formula (1) described earlier, the increase G in the intensity of light is about 17 times greater than that of an ordinary element having no resonator structure when Rc is 90% and Rh is 50%. Therefore, the quantity of light at the image forming surface is increased by 17 times when a display device comprising half mirrors is used for a projector and NA=sin 30°, or the lens is used with a full aperture of F number=1.

Note that the light path length between the half mirror 160 having four or eight layers and the reflector electrode 100 is made equal to ½ of the wavelength of light emitted from the EL element in the embodiments of FIGS. 15 and 16. However, it may alternatively be made equal to integer times of ½ of the wavelength of emitted light.

Besides, since the cathode, or the reflector electrode 100, is made of metal such as aluminum (Al), it reflects not only light from the EL layer 110 also external light directed to the viewer. However, as external light is reflected, the contrast of the image displayed on the display screen of the display device is reduced. In other words, the reflection of external light needs to be eliminated or minimized. Japanese Patent Application Laid-Open No. 8-8065 discloses an arrangement for reducing external light by making the cathode have two-layered structure, realizing the EL layer 110 as a light absorbing layer and arranging another electrode layer typically made of aluminum (Al).

Figure 21:
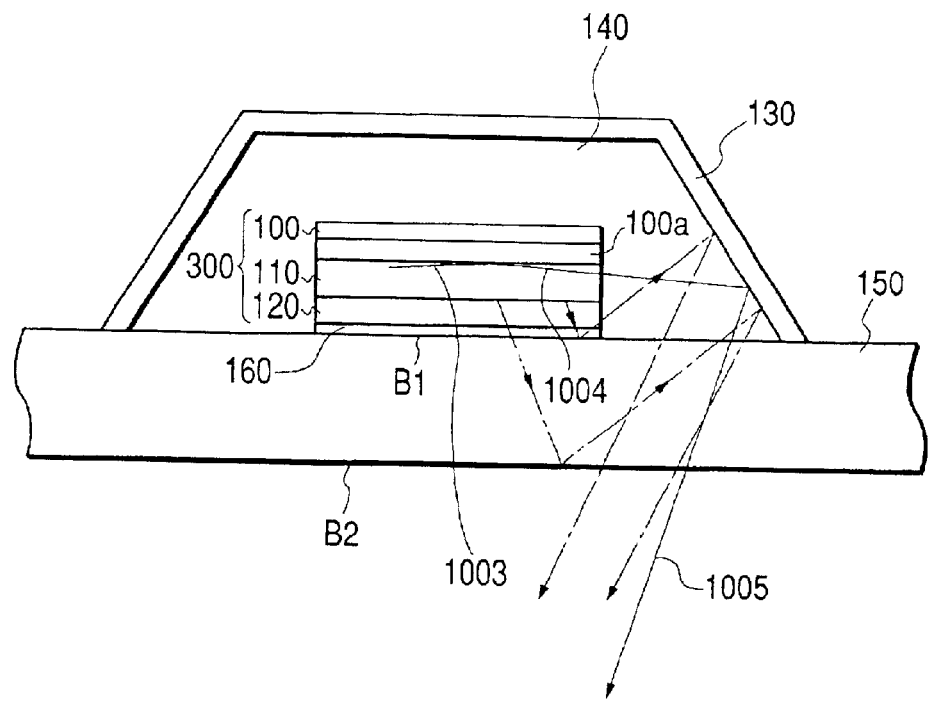
FIG. 21 is a schematic cross sectional view of an electroluminescent element having a light absorbing layer formed on a transparent substrate and operating as a pixel in the eleventh embodiment of the display device according to the invention.

FIG. 21 is a schematic cross sectional view of an electroluminescent (EL) element having a light absorbing layer formed on a transparent substrate and operating as a pixel in the eleventh embodiment of display device according to the invention. This embodiment differs from the above described ninth embodiment only in that a light absorbing layer 100*a* is formed between the EL layer 110 and the reflector electrode 100 of each EL element 300. Otherwise, this embodiment is identical with the ninth embodiment. Therefore, in FIG. 21, the components that are same as or similar to those of FIG. 15 are denoted respectively by the same reference symbols and will not be described any further.

In this embodiment, total reflection is realized at the interface of the light absorbing layer 100*a* and the EL layer 110 by making the refractive index of the light absorbing layer 100*a* located at a side of the EL layer lower than that of the EL layer 110. With this arrangement, light is totally reflected to return into the EL layer and reflected again by the reflection film 130 to consequently increase the proportion of light emitted to the outside from the display device.

When the EL layer 110 is made of aluminum quinolinol (alq), its refractive index will be about 1.73. Therefore, then, the light absorbing layer 100*a* is preferably made of MgO having a refractive index of 1.70. If the EL layer 110 comprises an electron transport layer, the refractive index of the light absorbing layer 100*a* needs to be made lower than that of the electron transport layer.

Referring to FIG. 21, light 1003 emitted from the EL layer 110 is totally reflected by the interface of the light absorbing layer 100*a* and the EL layer 110 to become light 1004, which is then reflected by the reflection film 130 to become light 1005 and go out of the display device.

Figure 22:
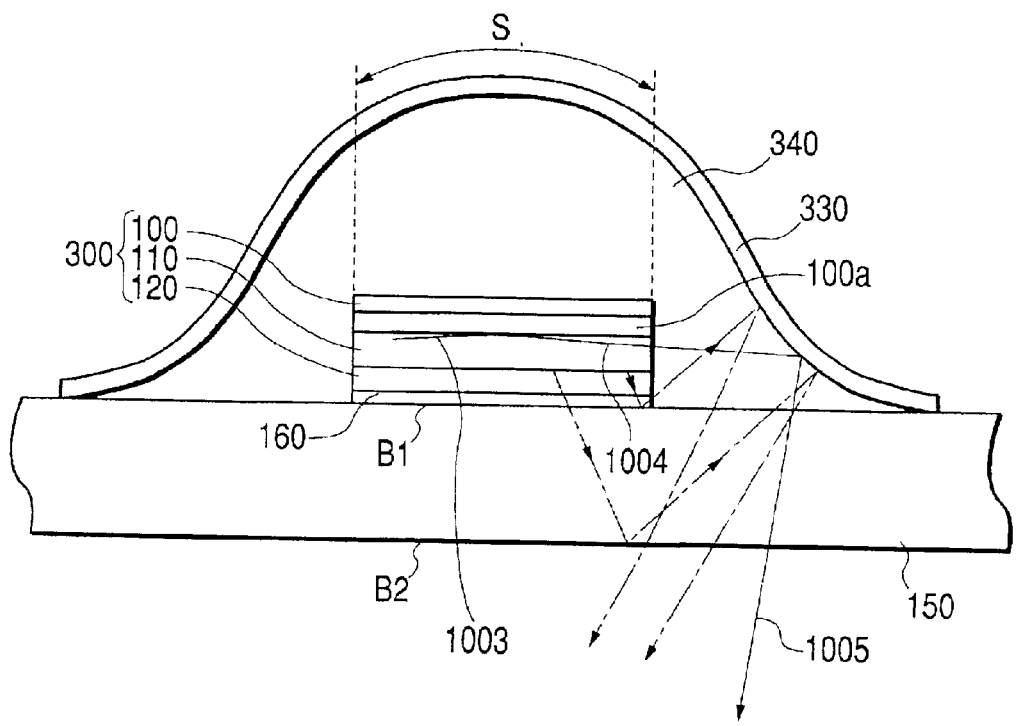
FIG. 22 is a schematic cross sectional view of an electroluminescent element having a light absorbing layer formed on a transparent substrate and operating as a pixel in the twelfth embodiment of the display device according to the invention.

FIG. 22 is a schematic cross sectional view of an electroluminescent (EL) element having a light absorbing layer in the twelfth embodiment of display device according to the invention. This embodiment differs from the above described tenth embodiment only in that a light absorbing layer 100*a* is formed between the EL layer 110 and the reflector electrode 100 of each EL element 300. Otherwise, this embodiment is identical with the tenth embodiment. Therefore, in FIG. 22, the components that are same as or similar to those of FIG. 16 are denoted respectively by the same reference symbols and will not be described any further.

The light absorbing layer 100*a* of this embodiment is preferably made of a material same as its counterpart of the eleventh embodiment. Referring to FIG. 22, light 1003 emitted from the EL layer 110 is totally reflected by the interface of the light absorbing layer 100*a* and the EL layer 110 to become light 1004, which is then reflected by the reflection film 330 to become light 1005 and go out of the display device.

As described above in detail, according to the invention, it is no longer necessary to arrange a protection film for shielding each EL element from ambient air after forming the transparent members. Nor is it necessary to design the manufacturing steps in such a way that, when a reflection film is formed on each transparent member, it is arranged so as not to contact the transparent electrode and the reflector electrode that sandwich the reflection film. Thus, it is possible to simplify the manufacturing steps and reduce the manufacturing cost. Therefore, according to the invention, the transparent members protect the EL elements from ambient air and light emitted from the EL layer of each EL element can be efficiently taken out to the outside by the reflection film formed on the corresponding transparent member.

The present invention is by no means limited to the above described embodiments, which may be modified or altered in various different ways without departing from the spirit or scope of the general inventive concept as defined by the appended claims and their equivalents.

What is claimed is:

1. A display device comprising:
   a transparent substrate;
   a plurality of electroluminescent elements arranged on said transparent substrate, each of said electroluminescent elements being formed by sequentially laying a transparent electrode, an electroluminescent layer and a reflector electrode on said transparent substrate;
   transparent members having a profile of a frustum of pyramid or cone and respectively covering said electroluminescent elements; and
   reflection films formed respectively on surfaces of said transparent members.

2. A display device according to claim 1, further comprising:

a plurality of drive elements arranged to drive the respective corresponding electroluminescent elements to emit light, said drive element being coated respectively with said transparent members.

3. A display device according to claim 2, further comprising:

an insulating body filling gaps separating said transparent members and wires formed on said insulating body;

said drive elements being connected respectively to said wires.

4. A display device according to claim 1, further comprising:

an insulating body filling gaps separating said transparent members, and wires formed on said insulating body;

said reflector electrodes and said transparent electrodes of said electroluminescent elements being connected respectively to said wires.

5. A display device according to claim 1, wherein each of said electroluminescent elements comprises a half mirror arranged between said transparent substrate and said transparent electrode, with a light path length between said half mirror and said reflector electrode being integer times of ½ of a wavelength of light emitted from said electroluminescent element.

6. A display device according to claim 5, wherein the light path length between said half mirror and said reflector electrode is equal to the wavelength of light emitted from said electroluminescent element.

7. A display device according to claim 1, wherein each of said electroluminescent elements further comprises a light absorbing layer arranged between said reflector electrode and said electroluminescent layer and having a refractive index lower than that of said electroluminescent layer.

8. A display device according to claim 7, wherein said electroluminescent layer of each of said electroluminescent elements includes an electron transport layer arranged at a side of said reflector electrode, and the refractive index of said light absorbing layer is lower than that of said electron transparent layer.

9. A display device according to claim 1, wherein each of said electroluminescent elements further comprises a silica aerogel film layer arranged between said transparent substrate and said transparent electrode.

10. A display device according to claim 1, wherein each of said electroluminescent elements has an air gap formed between said transparent substrate and said transparent electrode.

11. A display device comprising:

a transparent substrate;

a plurality of electroluminescent elements arranged on said transparent substrate, each of said electroluminescent elements being formed by sequentially laying a transparent electrode, an electroluminescent layer and a reflector electrode on said transparent substrate;

transparent members respectively covering said electroluminescent elements, each of said transparent members partly having a curved surface showing a positive curvature, a part thereof held in contact with said transparent substrate having a curved surface showing a negative curvature; and reflection films formed respectively on surfaces of said transparent members.

12. A display device according to claim 11, wherein each of said reflection film operates as a concave mirror relative to the corresponding electroluminescent element, and a focal plane of the concave mirror is located within said electroluminescent element.

13. A display device according to claim 11, further comprising:

a plurality of drive elements arranged to drive the respective corresponding electroluminescent elements to emit light, with said drive elements being coated respectively with said transparent members.

14. A display device according to claim 13, further comprising:

an insulating body filling gaps separating said transparent members, and wires formed on said insulating body;

said drive elements being connected respectively to said wires.

15. A display device according to claim 11, further comprising:

an insulating body filling gaps separating said transparent members, and wires formed on said insulating body;

said reflector electrodes and said transparent electrodes of said electroluminescent elements being connected respectively to said wires.

16. A display device according to claim 11, wherein each of said electroluminescent elements comprises a half mirror arranged between said transparent substrate and said transparent electrode, with a light path length between said half mirror and said reflector electrode being integer times of ½ of a wavelength of light emitted from said electroluminescent element.

17. A display device according to claim 16, wherein the light path length between said half mirror and said reflector electrode is equal to the wavelength of light emitted from said electroluminescent element.

18. A display device according to claim 11, wherein each of said electroluminescent elements further comprises a light absorbing layer arranged between said reflector electrode and said electroluminescent layer and having a refractive index lower than that of said electroluminescent layer.

19. A display device according to claim 18, wherein said electroluminescent layer of each of said electroluminescent elements includes an electron transport layer arranged at a side of said reflector electrode, and the refractive index of said light absorbing layer is lower than that of said electron transparent layer.

20. A display device according to claim 11, wherein each of said electroluminescent elements further comprises a silica aerogel film layer arranged between said transparent substrate and said transparent electrode.

21. A display device according to claim 11, wherein each of said electroluminescent elements has an air gap formed between said transparent substrate and said transparent electrode.

* * * * *

UNITED STATES PATENT AND TRADEMARK OFFICE
CERTIFICATE OF CORRECTION

PATENT NO. : 6,858,983 B2 Page 1 of 1
DATED : February 22, 2005
INVENTOR(S) : Noritaka Mochizuki et al.

It is certified that error appears in the above-identified patent and that said Letters Patent is hereby corrected as shown below:

<u>Title page,</u>
Item [56], References Cited, FOREIGN PATENT DOCUMENTS, "03152898" should read -- 3-152898 --.

<u>Column 7,</u>
Lines 22, 52 and 61, "semispherical" should read -- hemispherical --.

<u>Column 14,</u>
Line 21, "S" should read -- P --.

Signed and Sealed this

Twenty-first Day of March, 2006

JON W. DUDAS
*Director of the United States Patent and Trademark Office*